United States Patent [19]
Adamian et al.

[11] Patent Number: 5,548,221
[45] Date of Patent: Aug. 20, 1996

[54] ELECTRONIC CALIBRATION METHOD AND APPARATUS

[75] Inventors: Vahe A. Adamian, Lexington; Michael T. Falcinelli, Andover; Peter V. Phillips, Leominster, all of Mass.

[73] Assignee: ATN Microwave, Inc., Billerica, Mass.

[21] Appl. No.: 473,724

[22] Filed: Jun. 7, 1995

Related U.S. Application Data

[60] Division of Ser. No. 156,277, Nov. 22, 1993, Pat. No. 5,467,021, which is a continuation-in-part of Ser. No. 66,534, May 24, 1993, Pat. No. 5,434,511.

[51] Int. Cl.⁶ .................................................. G01R 27/04
[52] U.S. Cl. ........................ 324/601; 324/638; 333/17.1; 333/18
[58] Field of Search ..................................... 324/601, 650, 324/651, 638; 333/17.1, 18

[56] References Cited

U.S. PATENT DOCUMENTS

| | | |
|---|---|---|
| 3,454,906 | 7/1969 | Hyltin et al. . |
| 3,559,108 | 1/1971 | Seidel . |
| 4,450,419 | 5/1984 | Schwarzmann . |
| 4,680,538 | 7/1987 | Dalman et al. . |
| 4,764,740 | 8/1988 | Meyer . |
| 4,816,767 | 3/1989 | Cannon et al. . |
| 4,839,578 | 6/1989 | Roos . |
| 4,939,485 | 7/1990 | Eisenberg . |
| 4,982,164 | 1/1991 | Schiek et al. . |
| 5,034,708 | 7/1991 | Adamian et al. . |
| 5,047,725 | 11/1991 | Strid et al. . |
| 5,097,215 | 3/1992 | Eul et al. . |
| 5,109,204 | 4/1992 | Keefer . |

FOREIGN PATENT DOCUMENTS

| | | | |
|---|---|---|---|
| 0150410 | 8/1985 | European Pat. Off. . | |
| 1345140A1 | 10/1987 | U.S.S.R. . | |
| 1345140 | 10/1987 | U.S.S.R. | ............................... 324/601 |
| WO89/04001 | 5/1989 | WIPO . | |

OTHER PUBLICATIONS

Hewlett–Packard App. Note: PN–8510–8, Oct. 1987 pp. 7, 11 & 13.
Curran: "TRL Calibration for Non–Coaxial Measurements"–HP Symposium–Oct. 1987.
Ferrero: "Two–Port Network Analyzer Calibration Using and Unknown (Thru)"–IEEE Letters on MW an Guided Waves–Dec. 1992.
Rabinovich: "An Instrument for Calibration and Tuning Waveguide Reflectometers" Telecomm. and Radio Energy–pp. 40–44–Sep. 1973.
Cronson, M. Harry, "A Six–Port Automatic Network Analyzer", IEEE Transactions on Microwave Theory and Techniques vol. MTT–25, No. 12, (Dec. 1977).
Hewlett–Packard Product Note 85610–13, "Measuring Noninsertable Devices" HP 8510–13 Network Analyzer, Aug. 1, 1988.
Ferrero, A. And Pisani, U., "Two–Port Network Analyzer Calibration an Unknown Thru", IEEE Microwave and Guided Wave Letters, vol. 2, No. 12, Dec. 1992, pp. 505–507.

(List continued on next page.)

*Primary Examiner*—Kenneth A. Wieder
*Assistant Examiner*—Jose M. Solis
*Attorney, Agent, or Firm*—Wolf, Greenfield & Sacks, P.C.

[57] ABSTRACT

A multistate electronic transfer standard provides electronic conditions to at least one of two ports of a vector network analyzer. One embodiment of the multistate electronic transfer standard includes a plurality of semiconductor interconnected by transmission lines. Each of the semiconductor devices are biased to generate different conditions at each of the two ports. A control computer controls the biasing of devices according to a predetermined procedure and compares impedance values measured for at least one of the two ports of the network analyzer to known values stored by the control computer. The control computer thereby derives calibration coefficients that are used by the network analyzer in performing further measurements.

6 Claims, 17 Drawing Sheets

OTHER PUBLICATIONS

Froelich, R., "Measurment of GaAs FET Noise Parameters", Watkins–Johnson Co., vol. 13, No. 6, Nov./Dec. 86, pp. 2–11.

Froelich, R., "Automated Tuning for Noise Parameter Measurements Using a Microwave Probe", Watkins–Johnson Co., 3/89, pp. 83–96.

Adamian, V., "Stable Source Aids Automated Noise–Parameter Measurements", The Time and Measurement Measurement Notebook, Feb. 1988, pp. 51–58.

Rytting, D., "Advances in Microwave Error Correction Techniques", Jun. 1, 1987, pp. 1–39.

Curran, J., "TRL Calibration for Non–Coaxial Measurements", Hewlett–Packard–Oct. 1987.

Hewlett–Packard, "Network Analyzers, Test & Measurements Catalog", Oct. 1991, USA.

Hewlett–Packard Product Note 8510–5A, "Specifying Calibration Standards for the HP 8510 Network Analyzer", Feb. 1, 1988.

ELECTRONIC CALIBRATION METHOD AND APPARATUS

This application is a division of application Ser. No. 08/158,277 filed Nov. 22, 1993, now U.S. Pat. No. 5,467,021 which is a continuation-in-part application under 35 U.S.C. §120 of application Ser. No. 08/066,534 filed on May 24, 1993, now U.S. Pat. No. 5,434,511.

FIELD OF THE INVENTION

This invention relates to a method and apparatus for automatically producing a plurality of complex reflection coefficients, a low-loss transmission coefficient, and a high isolation condition at the ports of a vector network analyzer.

BACKGROUND OF THE INVENTION

Measurement errors in any vector network analyzer (VNA) contribute to the uncertainty of the device being measured by the VNA. By quantifying these errors, their effects can be drastically reduced.

Measurement errors in network analysis can be separated into two categories: random errors and systematic errors. Random errors are non-repeatable measurement variations due to physical change (e.g. noise and temperature changes) and, therefore, are usually unpredictable. Systematic errors are repeatable measurement variations in the test setup itself (e.g. directivity, source match, and the like).

In most measurements made on "devices under test" (DUT) with a VNA, the systematic errors are the most significant source of measurement uncertainty. Therefore, it is desirable to remove these errors from the VNA measurements. This is achieved through a VNA calibration.

It is known in the prior art to connect a number of well-known physical standards (known as mechanical primary standards) to each of the two ports of the VNA for the purpose of calibration. Electrical characteristics of the mechanical primary standards are derived from known physical properties of the standards (e.g. physical dimension, conductor material, and the like). The systematic errors of the VNA can be determined by computing the difference between the VNA measured response of the mechanical primary standards and the known electrical characteristics of the mechanical primary standards.

However, before measuring the DUT, the performance of the calibration should be checked for its accuracy. It is, therefore, also common in the prior art to check the calibration accuracy by connecting another primary standard (a verification standard), which is different than that of the calibration standard, to the VNA. If the calibration of the VNA is performed properly, the measurement of the verification standard closely matches the known electrical characteristics of the verification standard. However, if the measurement of the verification standard does not comply with the known electrical characteristics of the verification standard, then the operator knows that the calibration was not performed properly, or that the VNA is not functioning properly.

Upon completion of verification of the VNA calibration, the operator can then connect the uncharacterized DUT to the VNA for measurement. The systematic error of the measurement system can then be removed mathematically from the measurement of the DUT.

A two-port DUT to be measured can have any of three possible configurations of connectors at its two ports. An "insertable" device has two connectors which are from the same connector family and of opposite sex, one connector being male and the other connector being female. An insertable two-port DUT is configured such that the calibration may be performed by connecting the two ports of a VNA together with the aid of a cable to establish a through-connection, during calibration, and without having to change the configuration of the measurement setup for the actual measurement of the DUT.

In contrast, a reversible DUT to be measured is characterized by two connectors of the same family but also of the same sex (either both male or both female). A reversible DUT is not "insertable" (e.g. "non-insertable") because the two ports of the VNA cannot be connected together to establish a through-connection during calibration without a first adapter. However, disadvantage of this setup is that the adapter becomes part of the calibration measurement. Therefore, it is common practice to calibrate the VNA with the first adapter, which is equal in electrical characteristics to a second adapter, then to switch the first adapter with the second adapter, and then perform the actual DUT measurement. This technique is used in order to try and reduce the measurement uncertainty. However, if the adapters are not equal in insertion loss, amplitude and phase match, and electrical length, then there is an added error in the calibration. Thus, any characteristic variations between these adapters causes added uncertainty in the measurement of the DUT. Alternatively, there is a second non-insertable calibration technique known in the art as "adapter-removal", which provides better calibration accuracy than the "adapter-swap" method described above, and which is shown in FIGS. 2 and 3 and described below.

A second category of a "non-insertable" DUT comprises a transitional device which has two connectors that are of different families (e.g. one connector being coaxial and the other being waveguide). Similar to the reversible DUT, the disadvantage to measurements made on a transitional DUT is that the DUT cannot be inserted into the measurement system using the identical configuration which was used to calibrate the measurement system.

As discussed above, it is common to use a calibration kit including a set of three mechanical primary standards of an appropriate connector family and sex to determine the error coefficients of a predetermined error model of a VNA. These primary standards usually consist of a short circuit connector, a shielded open circuit connector and either a fixed or sliding matched load termination. The fixed and sliding loads are generally mechanical transfer standards. A calibration kit also usually includes several phase-matched adapters for use in the non-insertable DUT "adapter-swap" calibration method as discussed above.

Full two-port calibration using a twelve-term error correction model to determine the systematic errors of a VNA is one of the most comprehensive calibration procedures. In order to determine all twelve terms of the error correction model for an insertable DUT, to be measured, each of the three primary measurement standards of the appropriate sex must be connected to the appropriate VNA port and measured. In addition, the two measurement ports of the VNA must be connected together via the use of a "through" connection.

The calibration setup and required connections to the primary standards for an insertable device are shown in FIGS. 1A and 1B. Thus, an insertable device requires a minimum of six one-port (short, open, load) calibration standards 100, 102, 104, 106, 108 and 110 to be connected in succession to the VNA 112 ports 114 and 116, respectively, (three for each port) and measured, and one through-connection (FIG. 1B) in order to determine the twelve terms of the error correction model.

Alternatively, a non-insertable device requires that an adapter 144, which has the same connector types and sex at each of its ports as the DUT to be measured, and the primary standards be connected to the VNA ports as shown in FIGS. 2 and 3. Thus, the technique requires a minimum of twelve primary standards 120, 122, 124, 126, 128 and 130 (FIG. 2A) and 132, 134, 136, 138, 140 and 142 (FIG. 3A) be connected to the VNA ports 114 and 116 and measured. Furthermore, two through-connections must be established (FIGS. 2B and 3B) in order to perform a full two-port calibration. Thus, referring to FIGS. 2 and 3, this technique requires that the adapter 144 be alternatively connected to each port 114 and 116 of the VNA 112 and a full two-port calibration be performed with the appropriate primary standards. Two calibration sets are then generated and used with the known electrical length of the adapter to compute actual S parameters of the adapter, which is, in turn, used to create a calibration set without the adapter (as if PORT 1 and PORT 2 of the VNA had been actually connected together). Thus, a non-insertable full two-port calibration requires a minimum of twelve primary standard connections and measurements and two through-connections and measurements. However, it is possible to make the two through-connections shown in FIGS. 2B and 3B in succession, thereby reducing the number of through-connections to one.

In addition, for a better accuracy calibration, a sliding termination is typically used instead of a matched load termination. A disadvantage of the sliding termination is that a measurement should be performed for at least three slide positions in order to obtain reliable measurements. Further, it is common in practice to use five slide positions for the matched load measurement at each port thereby resulting in a total of ten matched load position measurements. Thus, for an insertable DUT broadband calibration, a minimum of eighteen measurements and seven connections is standard; and for a non-insertable calibration a minimum of thirty-six measurements and thirteen connections is standard.

A disadvantage of the above-described calibration procedures is that each calibration standard must be connected and measured one at a time. This procedure involves connecting the standard to the VNA port using the appropriate hardware to ensure proper connection and once proper connection is ensured, pressing the appropriate hardware key on the VNA to make the appropriate measurement. In addition, once the measurement has been made, the standard must be disconnected and another standard must be connected using the same procedure. As discussed above, this procedure is repeated for a minimum of seven connections and eighteen measurements with a broadband insertable DUT and a minimum of thirteen connections and thirty-six measurements to measure a broadband non-insertable DUT. Further the electrical length of the adapter must be known in order to use the "adapter-removal" method, or equally matched adapters must be used in order to use the "adapter-swap" method.

As a further disadvantage, a non-trained operator may confuse the standards (which are often confusingly similar in appearance) and operate the wrong hardware key on the VNA, measuring the wrong calibration standard. If the mistake is discovered at the end of the calibration, then the entire calibration must be repeated. Alternatively, if the calibration is not verified by the operator, via the use of a verification standard, after the full two-port calibration, the operator typically does not know that the calibration is flawed and that the DUT measurements are incorrect.

Additionally, the constant connections and disconnections of the calibration standards required by the calibration procedure results in connector and port cable wear and, therefore, non-repeatability in the calibration standard measurements. This non-repeatability in measurements contributes an additional error term to the calibration measurement which cannot be corrected.

Still another disadvantage of the prior art method of calibration is that the manual calibration procedure tends to be cumbersome and slow. Thus, a significant portion of valuable testing time is spent each day calibrating the VNA. If the calibration is not done correctly, then the operator must start over. In addition, the cumbersome calibration is compounded by the fact that the VNA should be recalibrated, depending upon the application, at least once each day in order to ensure appropriate measurement accuracy.

Accordingly, it is an object of this invention to provide a method and apparatus for calibrating a VNA which requires, at most, two connections of the apparatus to any port of the VNA. It is a further object of this invention to provide a method and apparatus that essentially eliminates any errors resulting from connecting the wrong calibration standards to the VNA, and which allows untrained easy calibration of the VNA, while reducing the time required to perform the calibration. The calibration according to this method and apparatus can be performed automatically.

SUMMARY OF THE INVENTION

The present invention is directed to a method and apparatus for providing a programmable broadband, highly stable and repeatable multistate electronic transfer standard to be used in determining the systematic errors of a VNA.

In a first embodiment, the multistate electronic transfer standard is comprised of a plurality of semiconductor switching devices interconnected through transmission lines. Each semiconductor device can be forward or reverse-biased by programmable control circuitry. A multitude of well-known reflection coefficients can, therefore, be generated at each port of the multistate electronic transfer standard by forward or reverse-biasing selected semiconductor devices via the programmable circuitry. In addition, all of the semiconductors can be reverse-biased such that the multistate electronic transfer standard provides a low-loss transmission through-connection between the ports of the multistate electronic transfer standard. Furthermore, a high isolation condition between the ports of the multistate electronic transfer standard can be obtained by forward-biasing several or all of the semiconductor devices simultaneously.

The programmable multistate electronic transfer standard can be connected to at least one port of the VNA in order to provide multiple complex impedances to at least one port of the VNA. These well-known impedances can be used as calibration standards for at least one port of the VNA for a one-port calibration. In addition, a full two-port calibration can be performed by providing, with the multistate electronic transfer standard, multiple well-known complex impedances to each port of the VNA, a low-loss transmission through-connection between the two VNA ports and a high isolation condition between the two ports.

BRIEF DESCRIPTION OF THE DRAWINGS

The foregoing and other objects and advantages of the invention will become more clear with reference to the following detailed description of the preferred embodiments as illustrated by the drawings in which.

DETAILED DESCRIPTION

Figure 4:
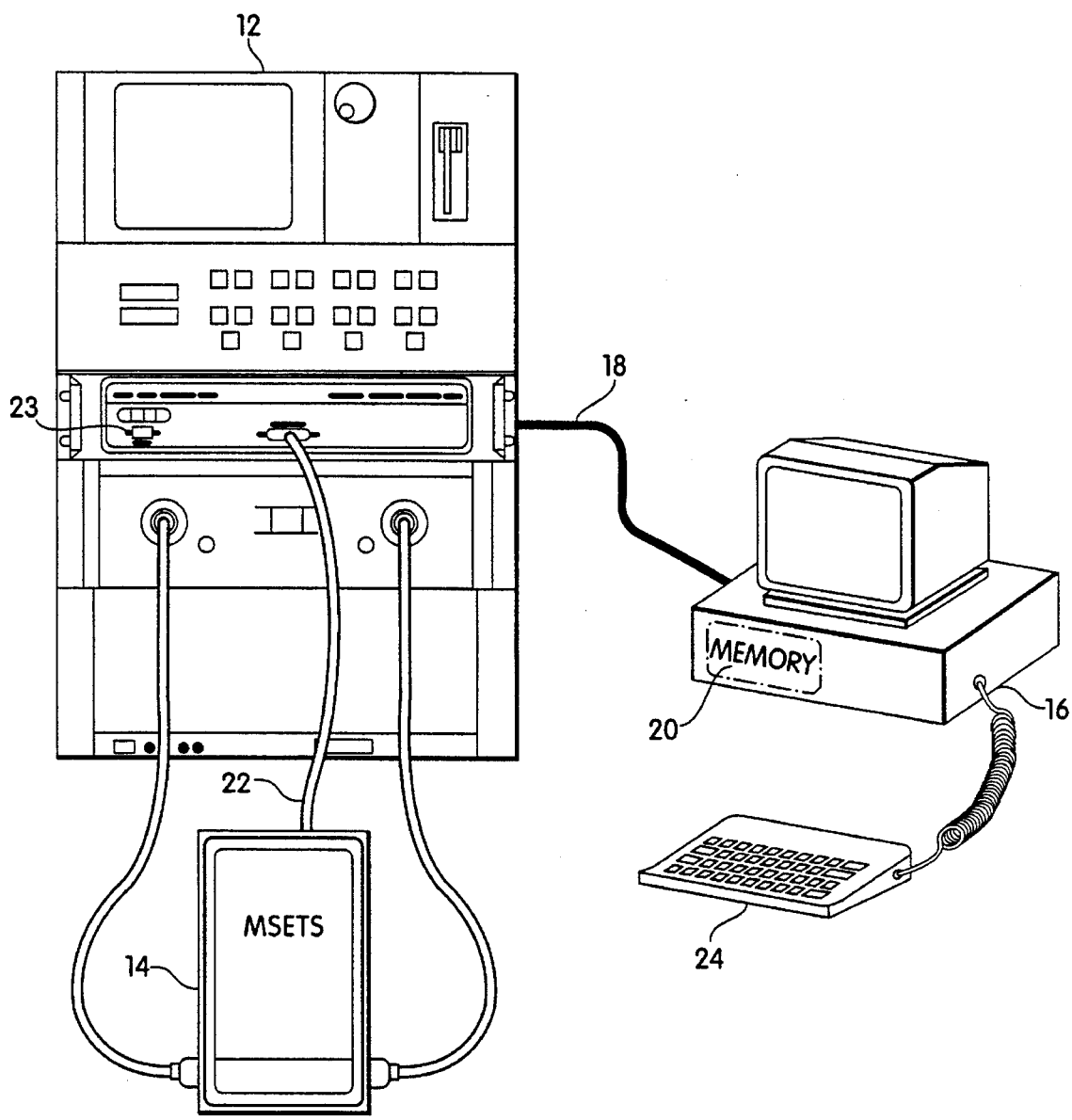
FIG. 4 is a block diagram of a calibration system according to this invention.

FIG. 4 illustrates a measurement setup according to a preferred embodiment which can be used with the present invention to calibrate a VNA. The setup includes the VNA 12, a two-port multistate electronic transfer standard (MSETS) 14 according to this invention, and a computer control 16. The computer control 16 includes a data line 18 to the VNA 12 to receive the measured data from the VNA 12 and to control the VNA 12 with the aid of software stored in a local or permanent memory region 20 of the computer 16. The measurement setup also includes a control line 22 between the interface 23 and the MSETS 14 which allows the computer or the VNA to control the MSETS in accordance with the control software stored in the memory of the computer. In addition, the computer control 16 includes a keyboard interface 24 for interaction with an operator. Note that while a computer control 16 is illustrated in this embodiment, the computer functions can be incorporated into the VNA 12, or into a microprocessor or other hardware and software device, directly provided to the MSETS 14.

Figure 5:
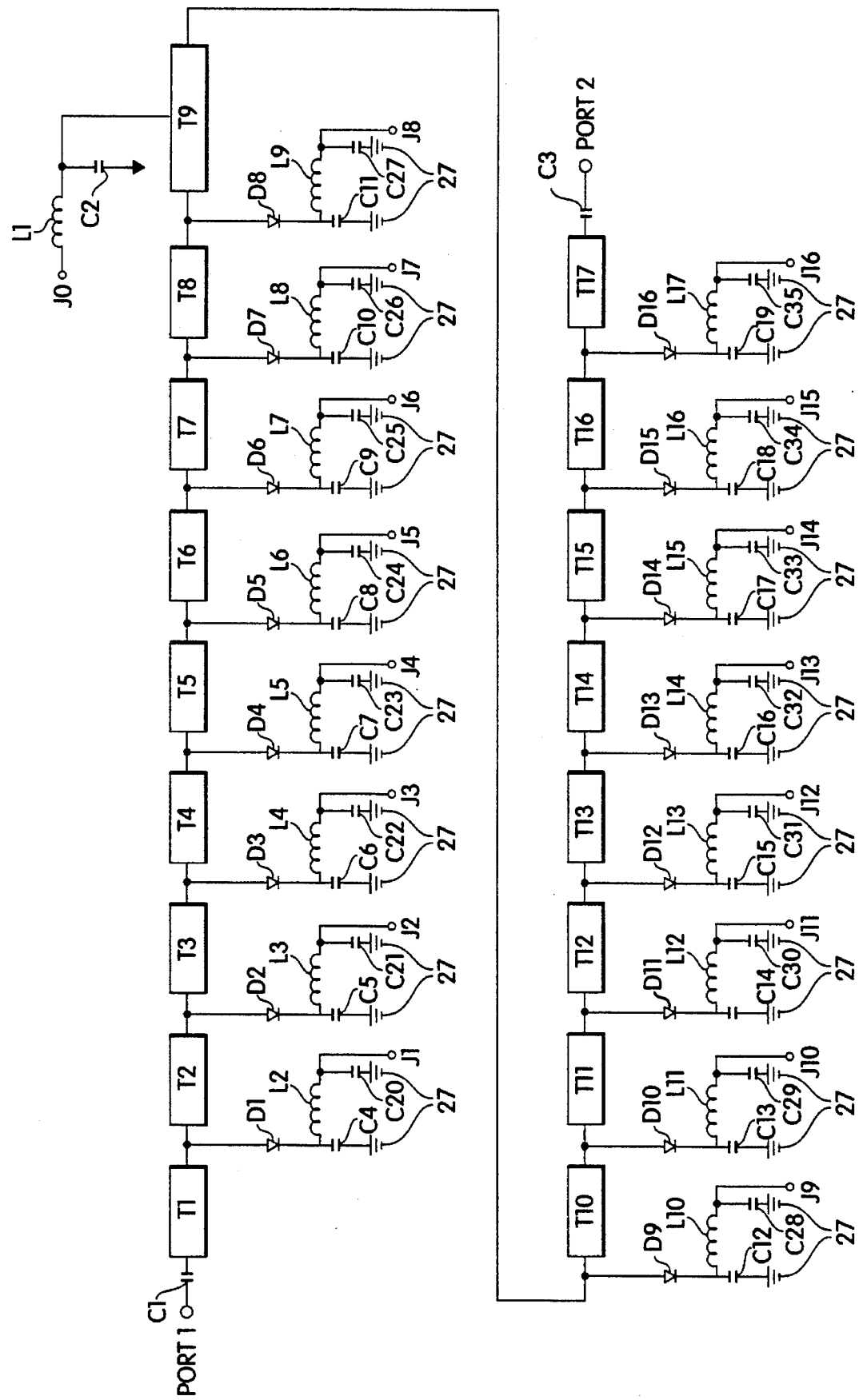
FIG. 5 is a detailed schematic diagram of an embodiment of a microwave portion of a multistate electronic transfer standard according to this invention.

FIG. 5 is a schematic of the microwave circuitry 25 contained in the MSETS 14 of the present invention. This circuitry is of a type disclosed in Applicants' U.S. Pat. No. 5,034,708 relating to a Broadband Programmable Electronic Tuner. The teachings of this patent are expressly incorporated by reference hereinto. The microwave circuitry 25 includes a number of pairs of PIN diodes D1–D16 and DC blocking capacitors C4–C19 in series which are separated according to this embodiment by various lengths of microstrip transmission line T1–T17. The series capacitor C4–C19 and PIN diode D1–D16 combinations are shunted to ground 27. The DC blocking capacitors C4–C19 establish the RF connection of the cathode side of each respective diode D1–D16 to ground. In the preferred embodiment of the invention, the transmission lines T1–T17 are constructed from 10 mil thick, known dielectric substrates which are laminated with copper on both sides, wherein one side is etched to the appropriate dimensions. While such transmission line is utilized, equivalent forms of transmission line that establish a given electrical length are contemplated according to this invention. Similarly, while PIN diodes are utilized, other forms of switching semiconductor devices are contemplated.

Referring to FIG. 5, a DC bias current is constantly established at connection J0. This current is established by a +5 volt supply according to a preferred embodiment. This DC bias current is supplied to the anode side of any of the PIN diodes D1–D16 through the RF bypass network consisting of RF coil inductor L1 and RF shunt capacitor C2. The RF bypass network prevents the interaction of RF and DC signals. Any of the PIN diodes D1–D16 can be forward-biased by providing a DC current return path to the cathode sides of any of the diodes via any of the control lines connections J1–J16. By individually controlling the connection of the control lines J1–J16, any one corresponding individual diode D1–D16 may be forward- or reverse-biased. Each control line connection also includes an RF bypass circuit consisting of a series RF coil L2–L17 and a shunt RF capacitor C20–C35 which prevents interaction between the RF signals and the DC bias signals.

In FIG. 5, the DC blocking capacitors C1 and C3, which are placed in series with the RF transmission lines at the input of PORT 1 and PORT 2, prevent the DC bias signals used to bias the PIN diodes from exiting the two-port MSETS.

The MSETS allows for a multitude of conditions to be established over a broad frequency band at both of its PORTS 1 and 2. These conditions include presenting a multitude of complex impedances at each port, a low-loss through-connection between the ports and a high isolation condition. In addition, the length and width of the transmission lines T2–T16 are chosen to ensure a unique phase relationship between each of the PIN diodes D1–D16. The selection of transmission line electrical length is based on the principle of prime numbers described in Applicants' U.S. Pat. No. 5,034,708, which is expressly incorporated hereinto by reference. This principle provides for minimizing the repetition of impedance values at either port of the MSETS. Thus, employing the prime number relationship ensures that the total line length from either input port of the MSETS to each diode is not evenly divisible by the line length from the input port to any other diode. However, other length relationships can be utilized according to this invention.

In FIG. 5, the microwave circuit allows for a plurality of microwave impedances, spread across the complex reflection plane, to be presented at both ports of the calibrator network by controlling the signal present at the control lines J1–J16. By way of example, the microwave circuit can be considered as being a symmetrical circuit comprised of two equal circuits. Circuit one is comprised of transmission lines T2–T8 and the corresponding shunt PIN diode D1–D8 and series capacitor C4–C10 pairs between these transmission lines. Circuit two is comprised of transmission lines T10–T16 and the corresponding shunt PIN diode D9–D16 and series capacitor C12–C19 pairs. These two circuits are joined by transmission line T9 which is fed by the DC current supply connection J0 and the RF bypass network. The circuit is designed such that the transmission lines T2–T8 and T10–T16 are symmetrical about the transmission line T9. Therefore, transmission line length T2 is equal to transmission line length T16, T3 equals T15, T4 equals T14, T5 equals T13, T6 equals T12, T7 equals T11 and T8 equals T10. The length of the transmission line T9, according to this embodiment, is chosen so that, at the lowest frequency of desired operation, the round trip electrical length between PORT 1 to PIN diode D1 and the round trip electrical length between PORT 1 and PIN diode D14 is a minimum of 240 degrees of phase difference for the condition where each diode is alternatively forward-biased and the electrical length is measured. Similarly, the same phase relationship will exist at the lowest frequency of operation when diodes D3 and D16 are forward-biased one at a time and connection is made to PORT 2.

In FIG. 5, the PIN diodes can be operated in one of two states. In a forward-biased state, the PIN diodes act as very small resistors (substantially short circuits). In a reverse-biased state, the PIN diodes can be modeled as a very small capacitor, at RF frequencies, and therefore a very high impedance (substantially open circuits). Establishing a DC ground connection to any of the control lines J1–J16 ensures that the appropriate diode is forward-biased. Alternatively, any of the control lines J1–J16 can be set to a positive voltage substantially larger than that at port J0 so that the appropriate PIN diode will be reverse-biased. Thus, it is possible to present a number of different impedances to either port of the MSETS. In addition, when all of the control lines are connected to DC ground such that all the PIN diodes are forward-biased, the two-port MSETS acts as a large-value attenuator providing a substantial amount of isolation between PORTS 1 and 2. In contrast, when all of the control lines are set to a positive voltage so that all of the PIN diodes D1–D16 are reverse-biased, the two-port MSETS acts as a low-loss through-connection between PORTS 1 and 2.

In a preferred embodiment, each capacitor C1–C3 has a capacitance of 200 pF, C4–C9 has a capacitance of 100 pF and C20–C35 has a capacitance of 820 pF; each inductor has an inductance of 40 nH; each transmission lines has a width of 0.30" and a physical length of T1=T17=0.061", T2=T16= 0.035", T3=T15=0.039", T4=T14=0.035", T5=T13=0.039", T6=T12=0.035", T7=T11=0.214", T8=T10=0.243" and T9=0.627"; and each diode has a periphery of 0.015"× 0.015"×0.005" with a series resistance of 2 ohms and a junction capacitance of 0.1 pF.

Figure 6:
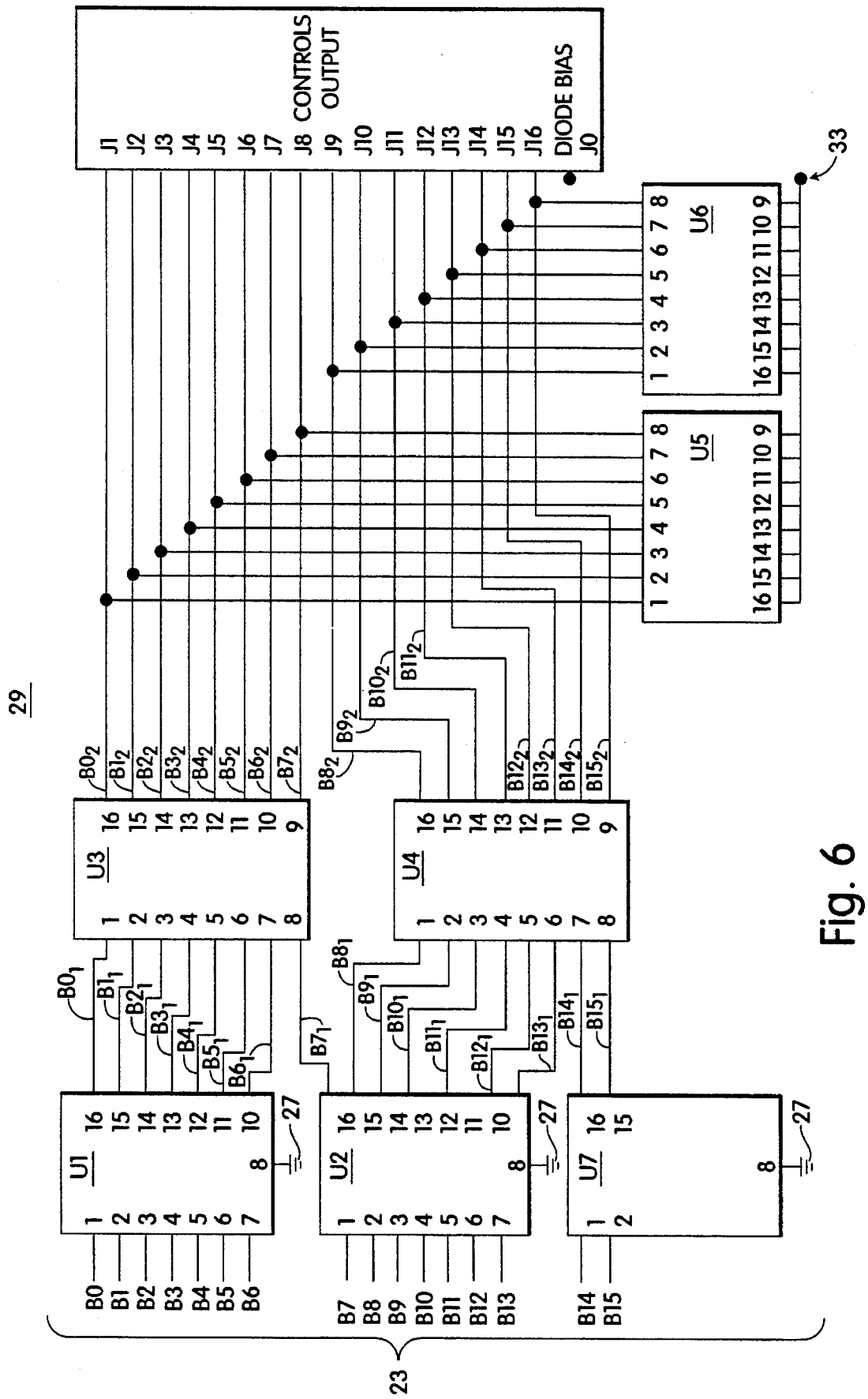
FIG. 6 is a detailed schematic diagram of a digital control circuit for operating the multistate electronic transfer standard circuit of FIG. 5.

FIG. 6 is a schematic of the digital circuit 29 included in the MSETS. The digital circuit 29 provides the appropriate bias to the control ports J1–J16 in accordance with the control signal 23 received from the computer. The computer control signal 23 is received by three commercially available Darlington transistor arrays U1, U2 and U7 (SN 75468). The Darlington transistor arrays U1, U2 and U7 are configured to receive a 16-bit TTL signal output by the computer. The word is transmitted on signal lines B0–B15 to U1 pins 1–7, U2 pins 1–7 and U7 pins 1–2 respectively. U1, U2 and U7 pins 8 are connected to ground 27. A TTL logic high on any one input line B0–B15 results in a corresponding output of the Darlington array U1, U2 or U7 providing a DC ground signal to the corresponding output control line $BO_1$–$B15_1$. Output control lines $BO_1$–$B6_1$ are connected to respective pins 16–10 of U1, $B7_1$–$B13_1$ are connected to respective pins 16–10 of U2 and $B14_1$ and $B15_1$ are connected to respective pins 16 and 15 of U7. A TTL logic low input to any of the Darlington array input ports does not enable the corresponding Darlington array output and, thus, the corresponding control line $BO_1$–$B15_1$ is pulled up to a +50 volt signal level which is presented to the corresponding PIN diode control line.

In FIG. 6, a pair of 68 ohm resistor networks U3 and U4 are placed between the output control lines $BO_{1-B151}$ of the Darlington arrays U1, U2 and U7 and the corresponding output control lines $BO_2$–$B15_2$ and are used to limit the current which can be drawn by each diode. In addition, there is provided a pair of one Mega-ohm resistor networks U5 and U6 which are placed at the outputs $BO_{2-B152}$ of the 68 ohm resistor networks which are in series with a +50 volt bias supply 33 according to this embodiment. The voltage supply 33 and resistor networks U5 and U6 act as a pull-up network for each output control which is not selected by the input TTL signal, thereby ensuring that a strong reverse bias signal is maintained on each control line J1–J16 for a PIN diode which has not been selected.

Figure 7:
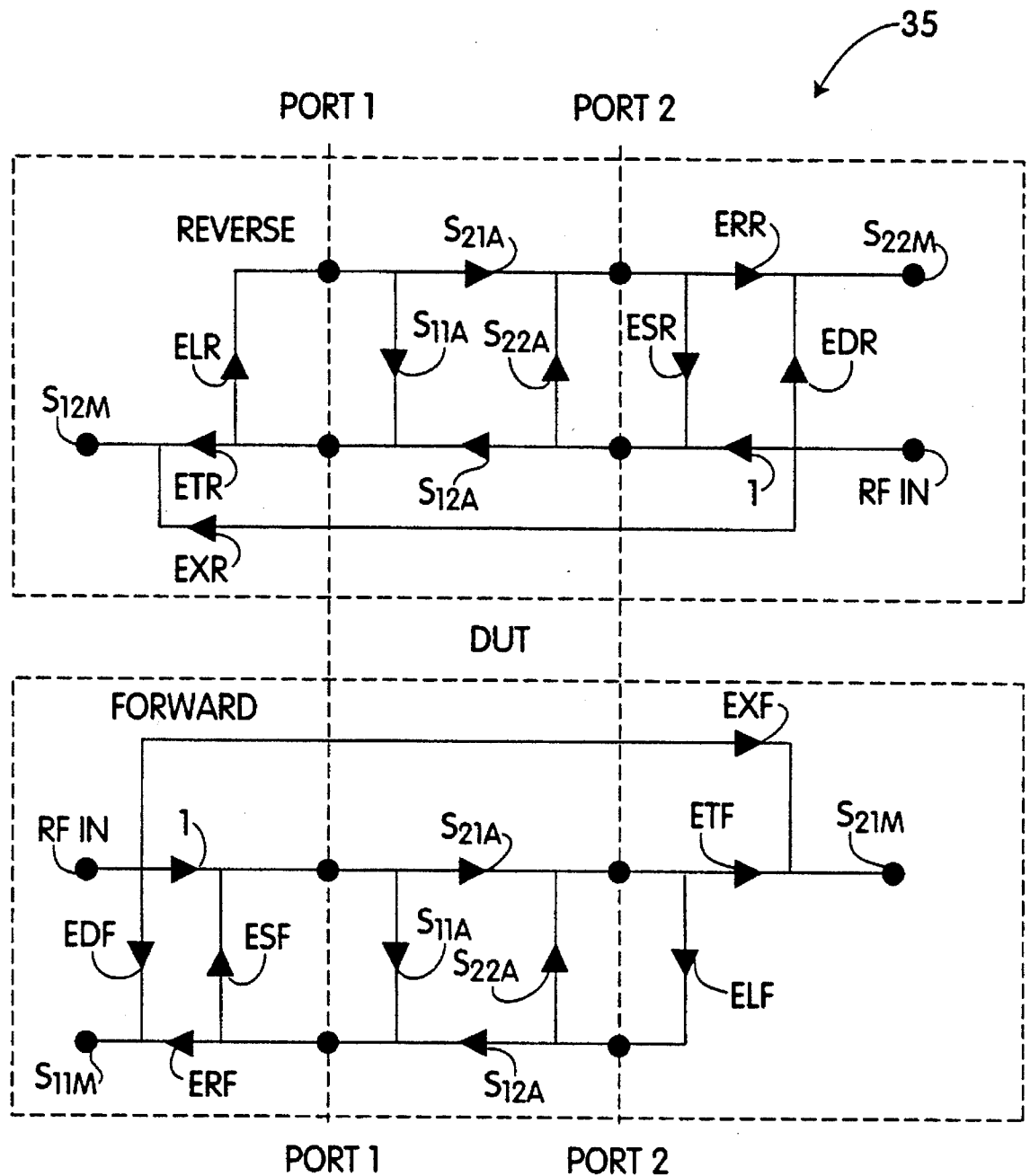
FIG. 7 is a flow-diagram of a two-port, twelve-term, error correction model for use with the multistate electronic transfer standard according to this invention.

FIG. 7 is a two-port, twelve-term error correction model 35 which may be used to model the systematic errors in a conventional VNA setup. In FIG. 7, the subscript notation is as follows: M stands for measurements made by the VNA which is being calibrated; A stands for actual measurements which were preformed by a VNA at a metrology laboratory F stands for measurements in a forward direction (looking into the two-port MSETS from PORT 1) and R indicates measurements in a reverse direction (looking into PORT 2 of the two-port MSETS).

As is known in the prior art, determining the error coefficients of the error correction model requires the connection of a number of known primary standards to the ports of the VNA. In accordance with one embodiment the present invention, there need only be a one-time connection to each port of the VNA. Such connections are typically made to both ports simultaneously. Thereafter, the MSETS and computer control provide a number of transfer standards, to the VNA ports, whose characteristics are known from previous measurements. The transfer standards include a plurality of impedances, a low-loss through-connection and a high isolation connection between the VNA ports. The transfer standards are measured by the VNA, are compared to previous measurements of the standards and the error coefficients of the twelve term error model are then calculated.

In addition in accordance with the present invention, the accuracy of the calibration may be increased where the number of impedances presented at both ports of the calibrator network can be greater than that required to compute the unknown error model coefficients, and, therefore, the additional impedance measurements may be used to improve the accuracy of the calculated coefficients. Furthermore, any random errors associated with calibration are substantially reduced due to the fact that only one connection to the VNA ports is required. Thus, with the present invention it is possible to reduce the random and systematic errors in the calibration and to improve the accuracy of the DUT measurement.

In addition, according to the present invention, the calibration speed is improved where a minimum number of connections may be made between the MSETS and the VNA and where the computer control program automatically controls the calibration without the need for operator input. An additional benefit of the present invention is that any connector configuration (e.g. insertable, non-insertable) of the DUT to be characterized can be accommodated by the present invention without a change in the calibration accuracy. This may be accomplished by providing the MSETS with a male connector on a first port and a female connector, of the same connector family, on the second port to provide an insertable MSETS. The insertable MSETS is then supplied with a male-to-male connector and a female-to-female connector as part of a complete calibration kit, thereby allowing for all possible insertable and non-insertable connector possibilities on the DUT to be measured. Alternatively, the MSETS can be custom-made with any connector sex and type on each of its ports.

Additional advantages of the MSETS of the present invention are that it can present a verification standard to the VNA, following calibration, in order to check that the calibration was performed correctly and to insure the accuracy of the calibration without the requirement of additional connections and/or disconnections to the VNA. Further, the computer control and the limited connections between the MSETS and the VNA, substantially eliminates the possibility of human error in the calibration.

Figure 8:
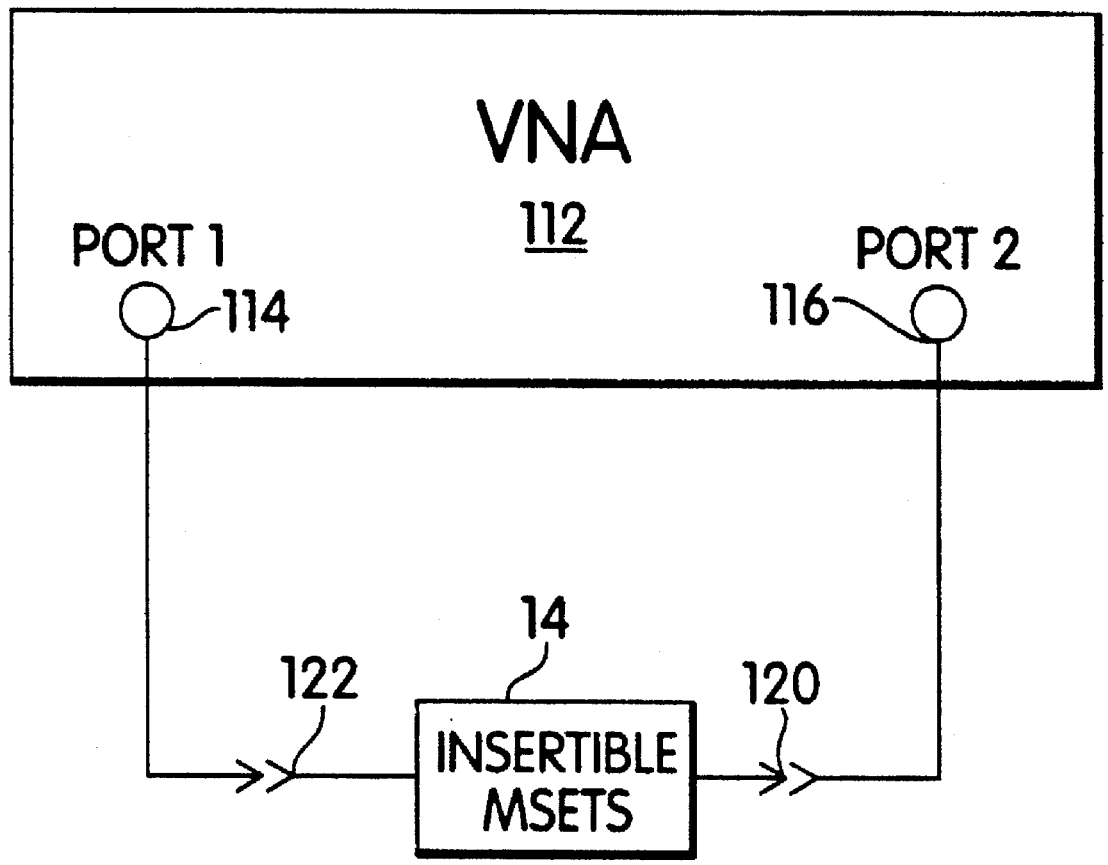
FIG. 8 is a schematic diagram illustrating connections to the multistate electronic transfer standard, wherein the DUT to be measured is an insertable device.

With reference to FIGS. 5 and 8, a method by which all twelve-term, error coefficients of FIG. 7 are determined will now be described. Where the DUT to be measured is an insertable device, an insertable MSETS, as shown in FIG. 8, having a male connector 120 at one port (PORT 2) and a female connector 122, of the same connector family, at its second port (PORT 1) is connected to the appropriate ports of the VNA. Note that FIG. 8 is by way of example only, and that the possible connector configurations of the insertable calibrator network and the VNA can also be reversed. For example, the insertable MSETS can be provided with a male connector at PORT 1 and a female connector at PORT 2.

First, a 16-bit digital word is input to the digital circuitry of FIG. 6 such that the PIN diodes D15 and D16 are forward-biased, thereby effectively presenting a short circuit impedance at PORT 2 of the insertable MSETS and also isolating PORT 2 from PORT 1 of the insertable MSETS. Equation 1 is derived from a flow graph analysis on the two-port, twelve-term error correction model 35 of FIG. 7 to solve for the measured reflection coefficient at PORT 1 ($S_{11M}$). In Equation 1, the terms $S_{11A}$, $S_{22A}$, $S_{21A}$, and $S_{12A}$, are the actual scattering parameters presented by the insertable MSETS and measured at a metrology laboratory with a VNA.

$$S_{11M} = EDF + ERF \frac{S_{11A} - ELF\ Det[SA]}{1 - ESF\ S_{11A} - ELF\ S_{22A} + ESF\ ELF\ Det[SA]} \quad (1)$$

$$Det[SA] = S_{11A} S_{22A} - S_{21A} S_{12A}$$

From Equation 1, it is clear that under the condition that $S_{21A}=S_{12A}=0$, Equation 1 reduces to Equation 2.

$$S_{11M} = EDF + ERF \frac{S_{11A}}{1 - ESF\ S_{11A}} \quad (2)$$

This condition is achieved practically, as described above, by forward-biasing diodes D15 and D16 such that PORT 2 is isolated from PORT 1. In Equation 2, the coefficient $S_{11A}$ is representative of the predetermined reflection coefficients measured by a VNA at a metrology laboratory (when diodes D15 and D16 and at least one other diode D1–D14 is "on") for various impedances presented at PORT 1. Therefore, by presenting and measuring at least three known impedances at PORT 1, The three error terms forward directivity EDF, forward reflection tracking ERE and forward source match ESF in Equation 2 can be solved for mathematically. Additionally, an improved accuracy in the error coefficient calculations may be achieved, by measuring more than three impedances at PORT 1 and performing a hermitian least sum squares fitting algorithm on the overdetermined set of equations.

Since the circuit in FIG. 5 is symmetrical, the same step can be used at PORT 2. Equation 3 represents the measured reflection coefficient $S_{22M}$ of the insertable MSETS derived by using a flow graph analysis at PORT 2 of the insertable MSETS from the error model of FIG. 7.

$$S_{22M} = EDR + ERR \frac{S_{22A} - ELR\ Det[SA]}{1 - ESR\ S_{22A} - ELR\ S_{11A} + ESR\ ELR\ Det[SA]} \quad (3)$$

By forward-biasing PIN diodes D1 and D2 at PORT 1 of the insertable MSETS, PORT 1 is isolated from PORT 2 of the insertable MSETS. As can be seen from Equation 3, if $S_{21A}=S_{12A}=0$ then Equation 3 reduces to Equation 4.

$$S_{22M} = EDR + ERR \frac{S_{22A}}{1 - ESR\ S_{22A}} \quad (4)$$

A number of predetermined impedances can be presented at PORT 2 by forward-biasing diodes D1 and D2 and at least one of diodes D3–D16. These impedances can be measured and used to calculate the three error terms reverse directivity EDR, reverse reflection tracking ERR and the reverse source match ESR of Equation 4. In addition, as discussed above, by measuring more than three known impedances and using a least sum squares fitting algorithm, the accuracy of the computed error terms can be increased.

Equations 5 and 6 represent the measured transmission coefficients in the forward direction (looking into the insertable MSETS from PORT 1) and the reverse direction (looking into the insertable MSETS from PORT 2) derived using a flow graph analysis technique on the two-port error correction model of FIG. 7.

$$S_{21M} = EXF + ETF \frac{S_{21A}}{1 - ESF\ S_{11A} - ELF\ S_{22A} + ESF\ ELF\ DET[SA]} \quad (5)$$

$$S_{12M} = EXR + ETR \frac{S_{12A}}{1 - ESR\ S_{22A} - ELR\ S_{11A} + ELR\ ESR\ DET[SA]} \quad (6)$$

It is clear from Equations 5 and 6, that if $S_{21A}=0$ then Equation 5 reduces to Equation 7.

$$S_{21M} = EXF \quad (7)$$

Similarly, it is clear from Equation 6, that if $S_{12A}=0$ then Equation 6 reduces to Equation 8.

$$S_{12M} = EXR \quad (8)$$

These conditions $S_{12A}=S_{21A}=0$ are accomplished by forward-biasing all of the PIN diodes D1–D16 such that a large value of attenuation exists between PORTS 1 and 2 of the insertable MSETS.

By measuring the transmission coefficients $S_{21M}$ and $S_{12M}$ (see Equations 7 and 8) when all of the diodes D1–D16 are forward-biased, the error terms forward isolation EXF and reverse isolation EXR can be computed.

Referring to the twelve-term, error correction model of FIG. 7, the scattering coefficients $S_{11A}$, $S_{21A}$, $S_{22A}$, and $S_{12A}$ are the known scattering parameters measured at the metrology laboratory during the original characterization of the insertable MSETS. In one measurement, these values are measured for the conditions where all of the PIN diodes D1–D16 are reverse-biased. Since, the one-port error terms for PORT 1 and PORT 2 were determined previously by the steps described above, by measuring the impedances at PORT 1 and PORT 2 where all of the PIN diodes are reverse-biased, the error terms forward load match ELF and reverse load match ELR can be computed from Equations 9 and 10.

$$ELF = \frac{(S_{11M} - EDF) - (S_{11M} - EDF)(ESF\, S_{11A}) - ERF\, S_{11A}}{(S_{11M} - EDF)S_{22A} - (S_{11M} - EDF)(ESF\, Det[SA]) - ERF\, Det[SA]} \quad (9)$$

$$ELR = \frac{(S_{22M} - EDR) - (S_{22M} - EDR)(ESR\, S_{22A}) - ERR\, S_{22A}}{(S_{22M} - EDR)S_{11A} - (S_{22M} - EDR)(ESR\, Det[SA]) - ERR\, Det[SA]} \quad (10)$$

In addition, by measuring the through-connection from PORT 1 to PORT 2 with a signal source at PORT 1 and alternatively from PORT 1 to PORT 2 with a single source at PORT 2, while PIN diodes D1–D16 are reverse-biased, the error terms forward transmission tracking ETF and reverse transmission tracking ETR can be computed from Equations 11 and 12.

$$ETF = \frac{(S_{21M} - EXF)[1 - ESF\, S_{11A} - ELF\, S_{22A} + ESF\, ELF\, Det[SA]]}{S_{21A}} \quad (11)$$

$$ETR = \frac{(S_{12M} - EXR)[1 - ESR\, S_{22A} - ELR\, S_{11A} + ELR\, ESR\, Det[SA]]}{S_{12A}} \quad (12)$$

Thus, all of the twelve-term error coefficients of the two-port error model of FIG. 7 can be computed using the steps described above and with a single connection of each port of the insertable MSETS to each port of the network analyzer and without any human intervention.

Furthermore, after the above-described calibration is complete, the insertable MSETS can then be used to simulate known transmission and reflection coefficients which have not been previously presented during the calibration procedure, as a verification standard for the purpose of checking the accuracy of the calibration. This can be performed immediately after the calibration, with the aid of the software and without any need for further connections or disconnections of the insertable MSETS or any human intervention. Upon verification of the insertable calibration the two-port insertable MSETS can then be removed and the insertable DUT connected for measurement.

Figure 1A:
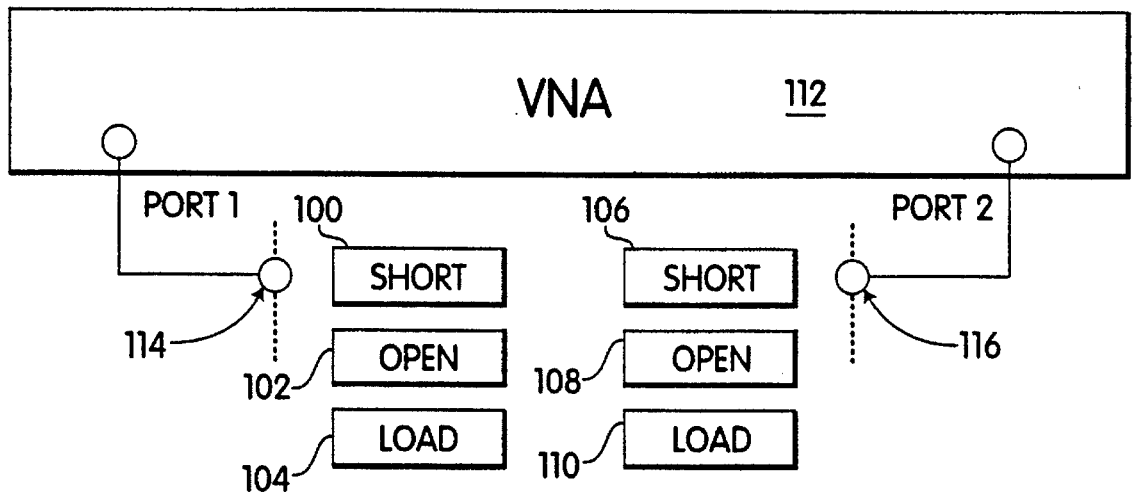
FIGS. 1A and 1B are schematic diagrams showing a calibration of a vector network analyzer for insertable devices to be measured according to a prior art method.
Figure 1B:
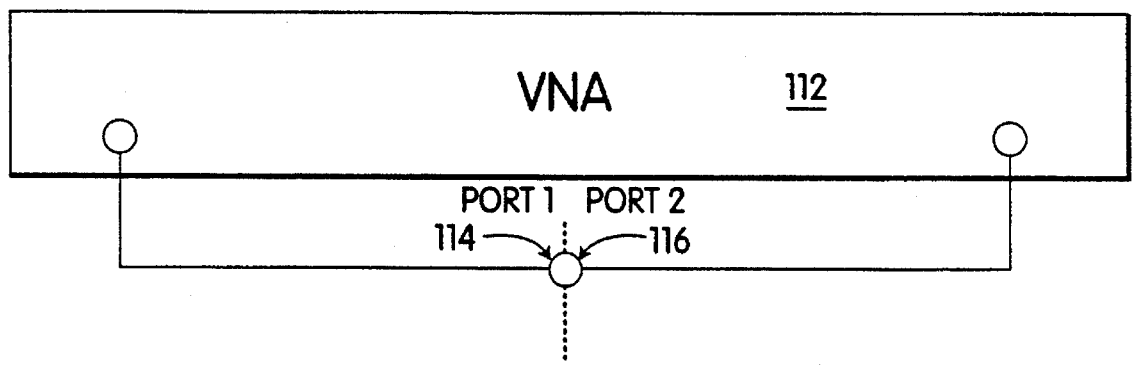
Figure 2A:
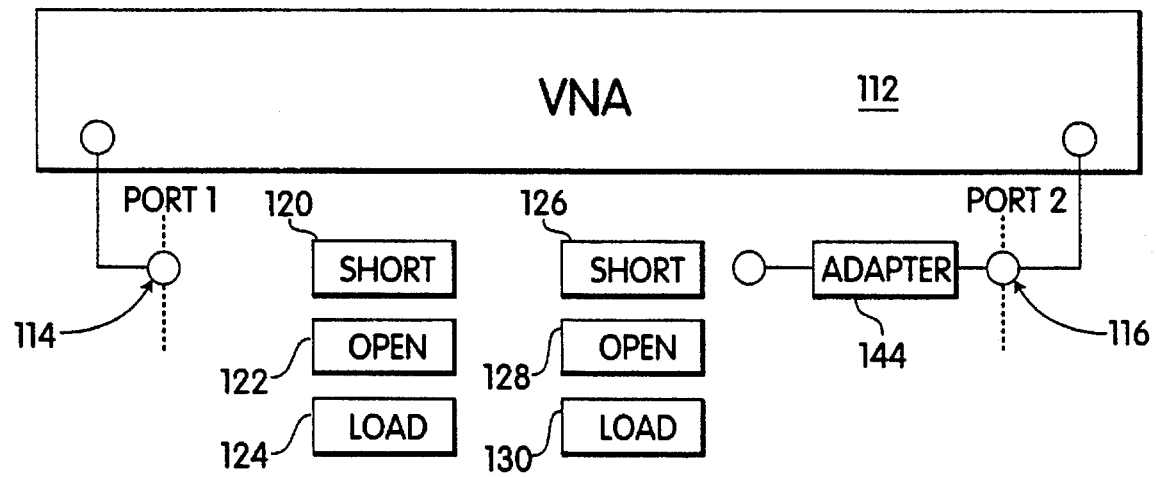
FIGS. 2A, 2B, 3A and 3B are schematic diagrams illustrating the calibration of a vector network analyzer for non-insertable devices to be measured using an "adapter-removal" technique on each of the two ports of the VNA according to the prior art method.
Figure 2B:
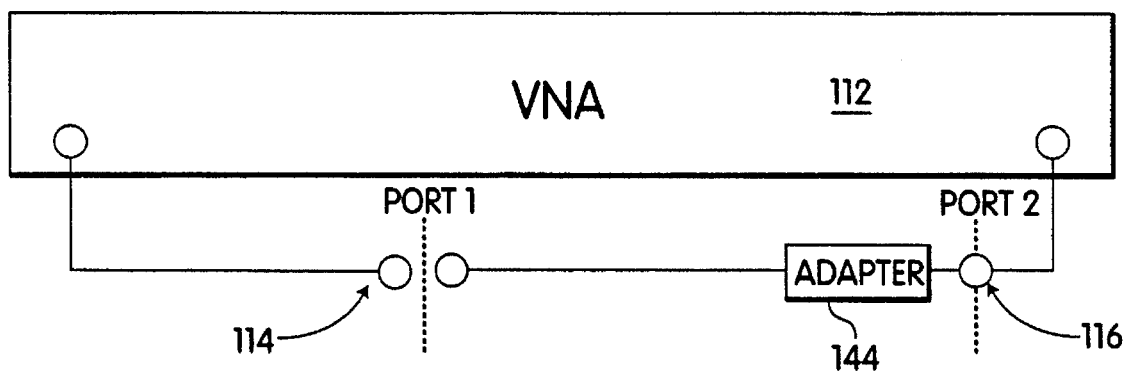
Figure 3A:
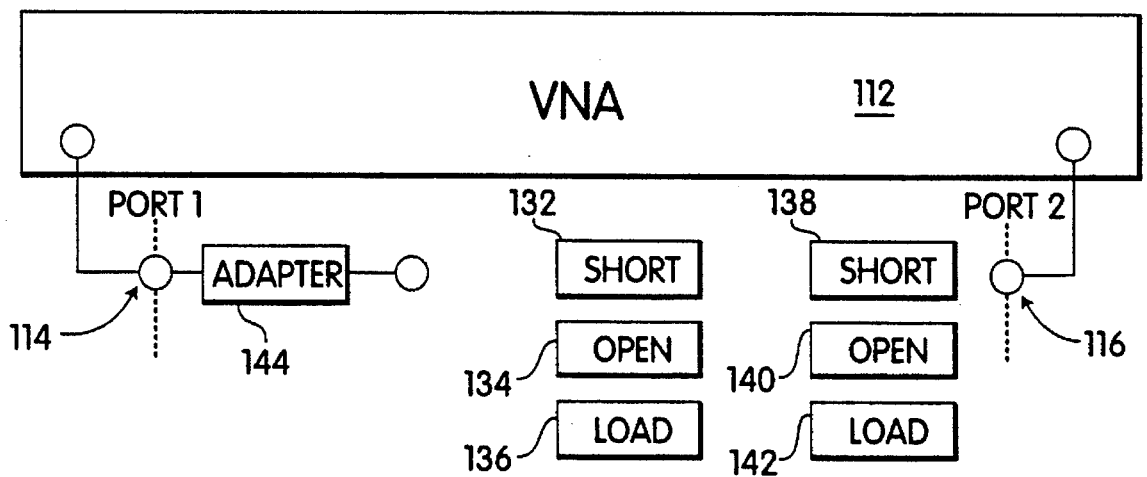
Figure 3B:
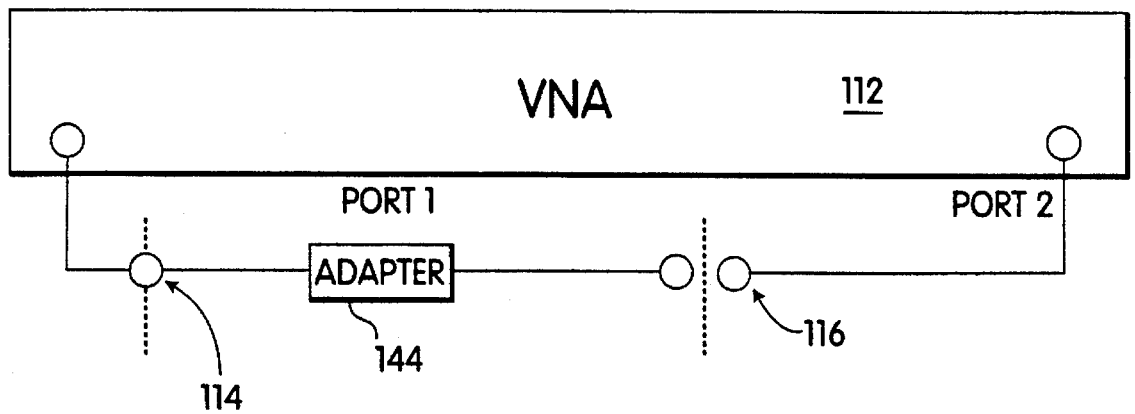

When the DUT to be measured is a non-insertable device, the insertable MSETS can be used in conjunction with an adapter for calibration of the VNA. The adapter (which is similar to adapter 144 of FIGS. 2A and B and 3A and B) is needed because the device is not insertable and, thus, the two ports of the VNA cannot be connected directly together with the aid of a cable without the adapter. Alternatively, a custom-made MSETS can be supplied with the sex and type connectors at each of its ports, as requested by a user. The error coefficients of the VNA can then be determined using the previously characterized custom made MSETS and Equations 1–12, as discussed above.

As discussed above, a kit is provided including the insertable MSETS, a male-to-male connector, a female-to-female connector, and the software for controlling the MSETS and VNA, which, together, comprise a non-insertable, MSETS kit. In the method described below, the adapter to be used with the insertable MSETS is chosen such that its connectors duplicate the connector configuration of the DUT to be measured.

Figure 9A:
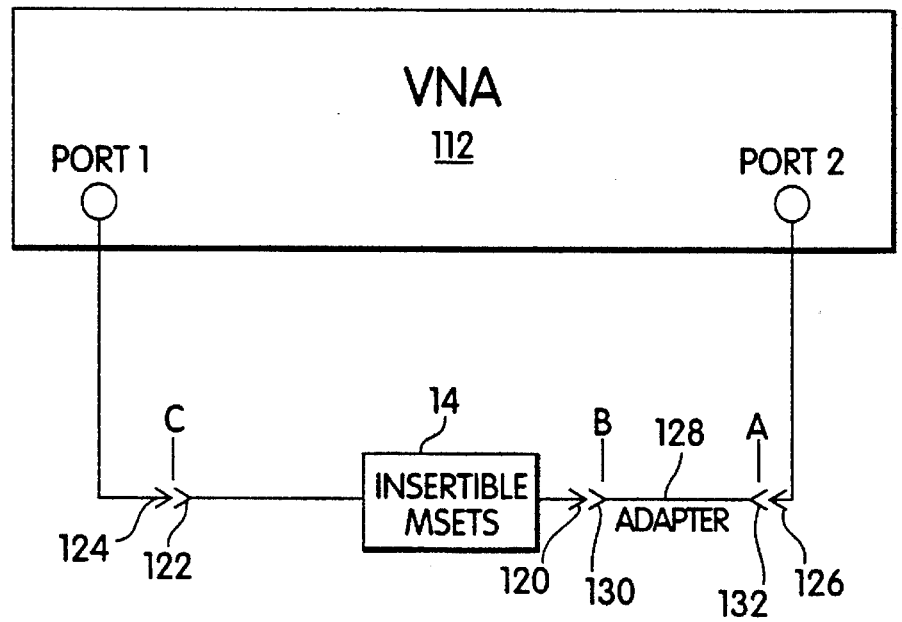
FIGS. 9A and 9B illustrate the connections to be made to the multistate electronic transfer standard, wherein the DUT to be measured is a non-insertable device.
Figure 9B:
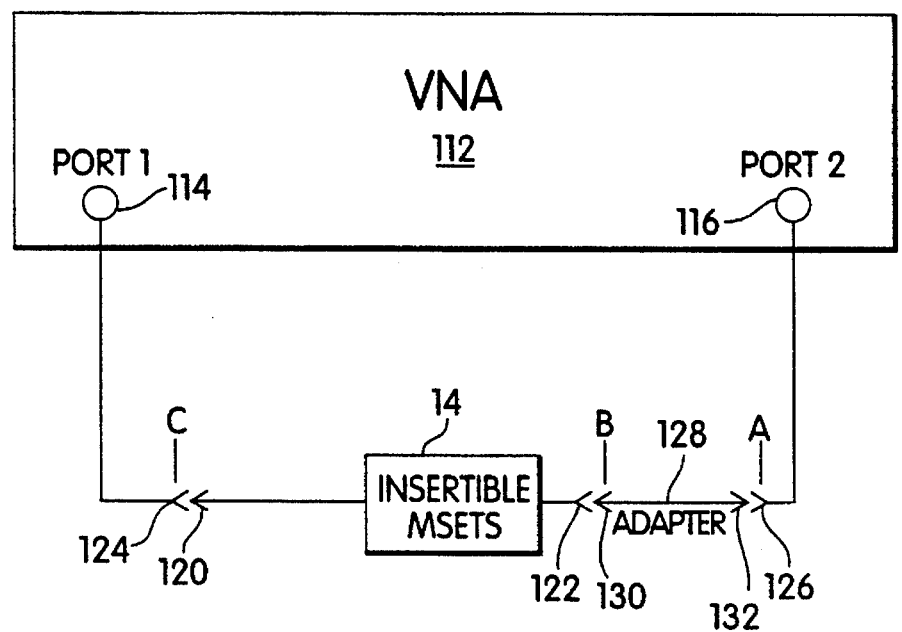

Referring to FIG. 9, there is shown an example of a VNA setup where the DUT to be measured has female connectors at both of its ports. In order for the VNA to mate with the non-insertable DUT, the connectors 124 and 126 on both of the VNA ports must be arranged to be male connectors. Similarly, referring to FIG. 9B, there is shown a corresponding VNA setup where the DUT to be measured has male connectors at both of its ports. Accordingly, the connectors 124 and 126 at both ports 1 and port 2 of the VNA are configured to be female connectors.

Figure 10A:
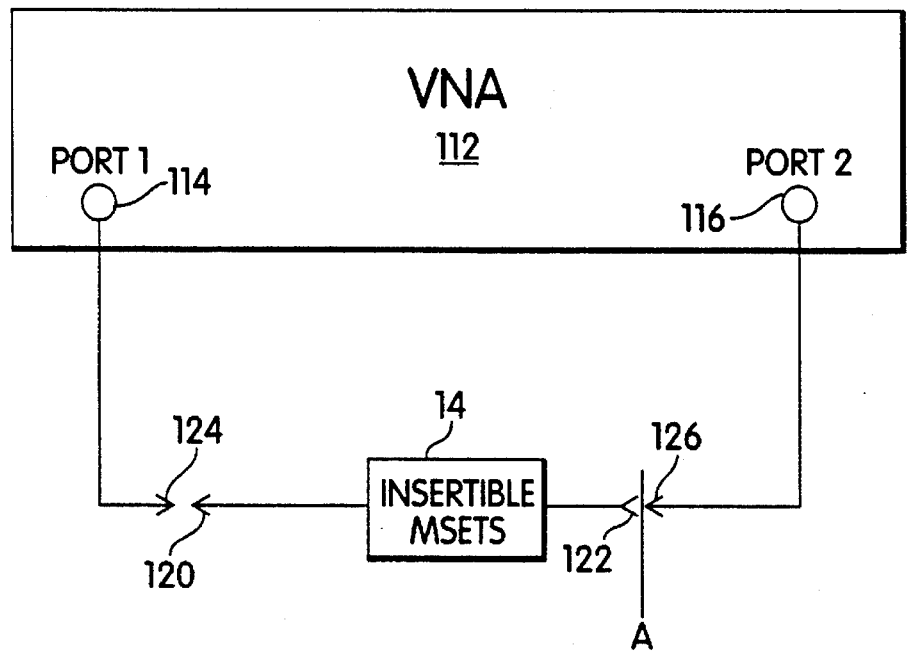
FIGS. 10A and 10B illustrate connections to be made to the multistate electronic transfer standard in order to calibrate the VNA, for a non-insertable device according to the present invention.

A method for calibrating the VNA for a non-insertable DUT to be measured will now be described. Referring now to FIG. 10A, there is illustrated the calibration setup according to a first step of this method. A port of the insertable MSETS which mates with a chosen port of the VNA is connected to the chosen port. In FIG. 10A, the chosen port of the VNA is illustrated as PORT 2 (116), however, the chosen port may also be PORT 1 (114). A port is chosen simply for the purpose of standardization in that if the same port is utilized all the time a routine is developed by the operator. The insertable MSETS is then configured to operate in a one-port mode to present a plurality of known reflection coefficients to the VNA at reference plane A, as shown in FIGS. 10A. Operation in a one-port mode is equivalent to the operation discussed above with respect to equations 2 and 4. Therefore, by presenting a number of predetermined impedances at PORT 2 of the VNA where some diodes of the insertable MSETS are forward-biased, these impedances can be measured and used to calculate the error terms EDR, ERR and ESR of equation 4.

Figure 10B:
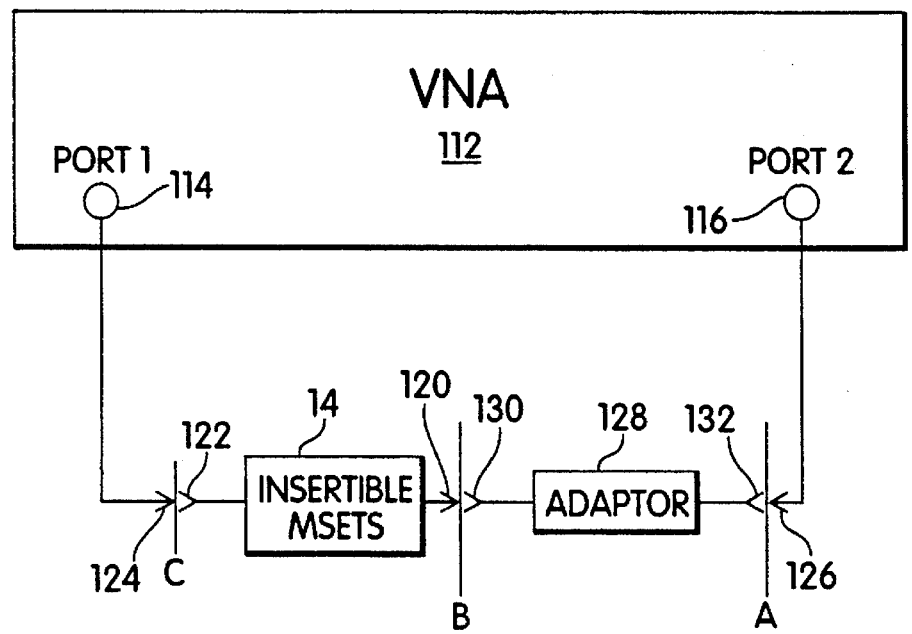

Referring now to FIG. 10B, the insertable MSETS is next disconnected from the VNA at reference plane A and is turned around and connected to the VNA at reference plane C (PORT 1) of the VNA. Also, an adapter 128 with the same sex connectors 130 and 132 as the DUT to be measured is inserted between the insertable MSETS network and PORT 2 of VNA. Thus as shown in FIG. 10B, a cascaded circuit of the insertable MSETS 14 and the adapter 128 comprise a non-insertable MSETS. Note that a female-to-female adapter is shown by way of example only in FIG. 10B, for the case where the DUT has female connectors at both of its ports. Alternatively, the adapter can also have male connectors at both of its ports and the VNA can have female connectors 124 and 126 at both of its ports, for the case where the DUT has male connectors at both of its ports.

Next, the scattering parameters of the adapter are computed from the known reflection coefficients of the insertable MSETS at reference plane B, which are known from previous meteorology laboratory measurements of the MSETS, and the one-port error correction coefficients which were determined, from the measurements of the insertable MSETS at reference plane A, in the first step of this method described above. In other words, scattering parameters of the adapter are determined using the following steps. The insertable MSETS is operated in a one-port mode, as discussed above with respect to equations 2 and 4, wherein known reflection coefficients are presented by the MSETS at reference plane B, and measured by the VNA at reference plane A. The reflection coefficient $S22'$ measured by the VNA at reference plane A, due to the known reflection coefficients presented by the insertable MSETS at reference plane B, is represented by the equation:

$$S_{22}' = S_{22_A} + \frac{S_{21_A} S_{12_A} \Gamma_B}{1 - S_{11_A} \Gamma_B} \quad (13)$$

wherein $S_{11A}$, $S_{21A}$, $S_{12A}$ and $S_{22A}$ are the scattering parameters of the adapter and $\Gamma_B$ is the known reflection coefficient of the insertable MSETS. By measuring at least three reflection coefficients S22' presented by the insertable MSETS at reference plane A for three known reflection coefficients $\Gamma_B$, the values of $S_{11A}$, $S_{22A}$, and $2_{21A}$. $S_{12A}$ can be determined. The reciprocity of the adapter results in $S_{21A}$ equal to $S_{12A}$.

Referring now to equation 13, let the product of $S_{21A} \times S_{12A}$ be represented by W. Given the reciprocal nature of the connector, then $S_{21A} = S_{12A} = \sqrt{W}$. However, W is a complex number, and its square root may, therefore, have two values, wherein the magnitude of both values is the same but the angles are 180° out of phase with respect to each other. Accordingly, W can be represented by equations 14 and 15:

$$S_{21_A} = S_{12_A} = \sqrt{w} = \sqrt{|w|}\, e^{-j\theta/2} \quad (14)$$

$$S_{21_A} = S_{12_A} = \sqrt{w} = \sqrt{|w|}\, e^{-j(\theta/2+\pi)} \quad (15)$$

Where $|w|$ = Absolute value of $w$ and $\theta$ = Argument of $w$

Therefore, in order to correctly determine the value of $S_{21A} = S_{12A}$, a boundary condition is used. To choose the correct arguments between equations 14 and 15, a proper boundary condition representing the phase of the coaxial connector at 0 Hertz is used. It is known in the prior art that all commercially available VNA's wrap the phase (argument) between ±180° as the frequency is swept between the start and stop points. By adding 360° to the argument as the frequency is swept across the ±180° crossover points, one can deduce the total phase rotation by unwrapping the argument. The unwrapped argument as a function of frequency can be fitted through a least sum squared fitting algorithm to a polynomial such as:

$$\theta = \sum_{i=0}^{2} A_i F^i = A_0 + A_1 F + A_2 F^2 \quad (16)$$

Where $A_i$ = Polynominal coefficients and $F$ = Frequency

It is also known that the phase angle of the coaxial connector must approach 0° as the frequency approaches DC. Therefore, the term $A_0$ of the phase expressions for equations 14 and 15 must be chosen to be the one which is closer to 0. Thus, the proper value of the phase can be determined and the S parameters of the adapter can be calculated utilizing equation 13. Therefore, according to the present invention, it is possible to calculate the scattering parameters of the adapter needed for a non-insertable calibration without knowing the electrical length of the adapter used as part of the calibration.

In order to transfer the scattering parameters of the through-connection state and the verification state, of the insertable MSETS, to reference plane A, the scattering matrices of the adapter, the through-connection state and the verification state are converted to chain scattering matrices. The chain scattering matrices can be computed utilizing the equation:

$$\psi = \begin{bmatrix} \dfrac{1}{S_{21}} & -\dfrac{S_{22}}{S_{21}} \\ \dfrac{S_{11}}{S_{21}} & \dfrac{S_{21}S_{12} - S_{11}S_{22}}{S_{21}} \end{bmatrix} \quad (17)$$

The chain scattering matrices of the insertable MSETS, operating in the through connection state, is transformed to reference plane A by multiplying the chain matrix of the insertable MSETS with the chain matrix of the adapter. Similarly, the chain scattering matrix of the insertable MSETS, operating in the verification mode, is multiplied by the chain scattering matrix of the adapter to transform the verification state to reference plane A. The resulting chain scattering matrices are then reconverted back to S parameter matrices utilizing the equation:

$$S = \begin{bmatrix} \dfrac{\psi_{21}}{\psi_{11}} & \dfrac{\psi_{11}\psi_{22} - \psi_{21}\psi_{12}}{\psi_{11}} \\ \dfrac{1}{\psi_{11}} & -\dfrac{\psi_{12}}{\psi_{11}} \end{bmatrix} \quad (18)$$

Referring to FIG. 10B, since connector 122 of the insertable MSETS network is connected directly to PORT 1 (114) of the VNA there is no need for transforming the S parameters presented by the insertable MSETS to PORT 1 of the VNA. Therefore, the S parameters of the insertable MSETS operating in the one port mode, the through state and the verification state are now known at connectors 124 and 126 of the VNA. The insertable MSETS is then operated to step through the steps of the method for the insertable calibration discussed above to determine the error correction coefficients for the non-insertable configuration as shown in FIGS. 9A or 9B. Thereafter, both the insertable MSETS and the adapter can be removed and the non-insertable DUT to be measured can be inserted for measurement.

Therefore, with the present invention it is possible to calibrate the network analyzer for a non-insertable DUT to be measured with a minimum of two connections to be made to any one port of the network analyzer. In addition, since the steps are all computer controlled, the possibility of user error is eliminated. Furthermore, the insertable MSETS simulates a verification standard so that the non-insertable calibration accuracy is checked without having to disconnect and connect any verification standards. Further, the non-insertable calibration is performed without having to connect any primary calibration standards to the VNA.

Figure 11:
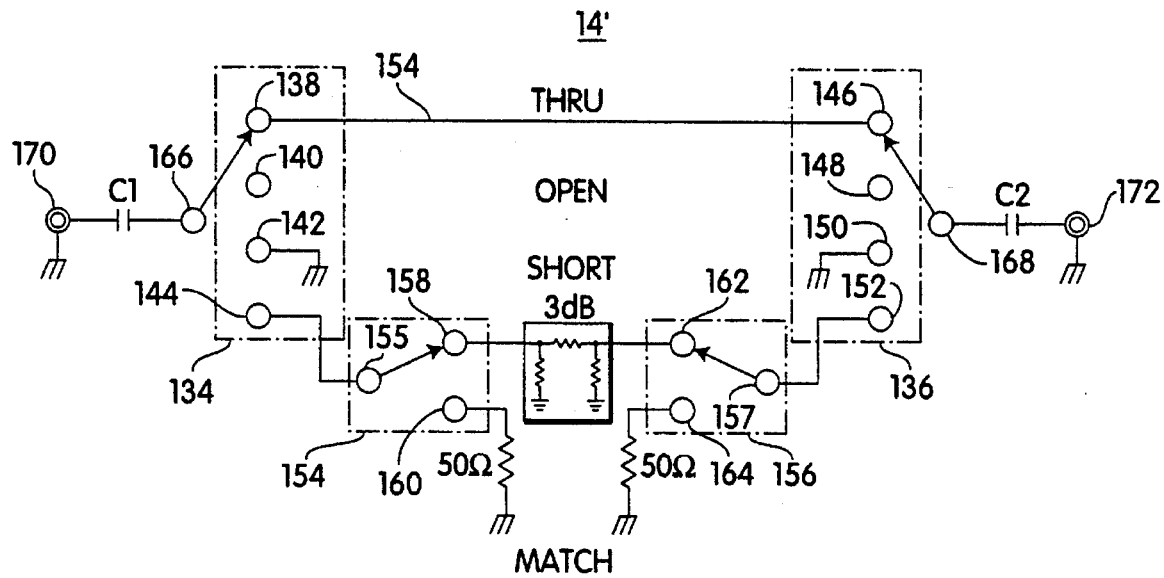
FIG. 11 is a schematic diagram of a second embodiment of the multistate electronic transfer standard of the present invention.

Referring to FIG. 11, there is shown a schematic diagram of microwave circuitry contained in a second embodiment of the MSETS 14' of the present invention. The second embodiment is utilized to extend the frequency of operation of the MSETS. The second embodiment can be used in conjunction with the first embodiment shown in FIGS. 5 and 6 to create an ultra-broad band MSETS.

The microwave circuitry, as shown in FIG. 11, includes a plurality of single-pole, multi-throw switches. For example there is shown two single-pole, four-throw switches 134 and 136. Each throw 138, 140, 142 and 144 of single-pole, four-throw switch 134 and each throw, 146, 148, 150, and 152 of single-pole, four-throw switch 136, is connected to a different impedance. For example, throws 138 and 146 are interconnected by a low loss through transmission line 154; throws 140 and 148 are connected to an open circuit; throws 142 and 150 are connected to a short circuit; and throws 144 and 152 are each connected to a pole 155 and 157 of single pole double throw switches 154 and 156. Throws 158, and 160 of single-pole, double-throw switch 154 and throws 162 and 164 of single-pole, double-throw switch 156 are each connected to a fixed impedance. For example, throws 158 and 162 are interconnected by a 3 dB fixed attenuator, and throws 160 and 164 are each connected to a fixed 50 Ohm matched termination.

In FIG. 11, DC blocking capacitors C1 and C2 are placed in series with poles 166 and 168 at input PORT 1 (170) and PORT 2 (172) to prevent any DC bias signals used to bias the single-pole, multi-throw switches from exiting the MSETS. The second embodiment of the MSETS also allows for a plurality of conditions to be established over an extended frequency band of operation at both of its PORTS 1 (170) and 2 (172). These conditions include presenting a multitude of complex impedances at each port, including: the open, the short, the matched termination and an intermediate impedance comprising a 3 dB attenuator. Further, these conditions include a low-loss through-connection between the ports. A through connection can be established between PORTS 1 and 2 by connecting pole 166 to throw 138 and pole 168 to throw 146. In addition, an open can be established at PORTS 1 and 2 by connecting poles 166 to throw 140 and pole 168 to throw 148. Further, a short circuit can be established at PORTS 1 and 2 by connecting pole 166 to throw 142 and pole 168 to throw 150. Still further, a matched termination can be presented at PORTS 1 and 2 by connecting pole 166 to throw 144, pole 155 to throw 160, pole 168 to throw 152, and pole 157 to throw 164. Finally, an intermediate impedance can be presented to either PORT I or 2 by connecting pole 166 to throw 144 and pole 155 to throw 158 or by connecting pole 168 to throw 152 and pole 157 to throw 162.

Figure 12:
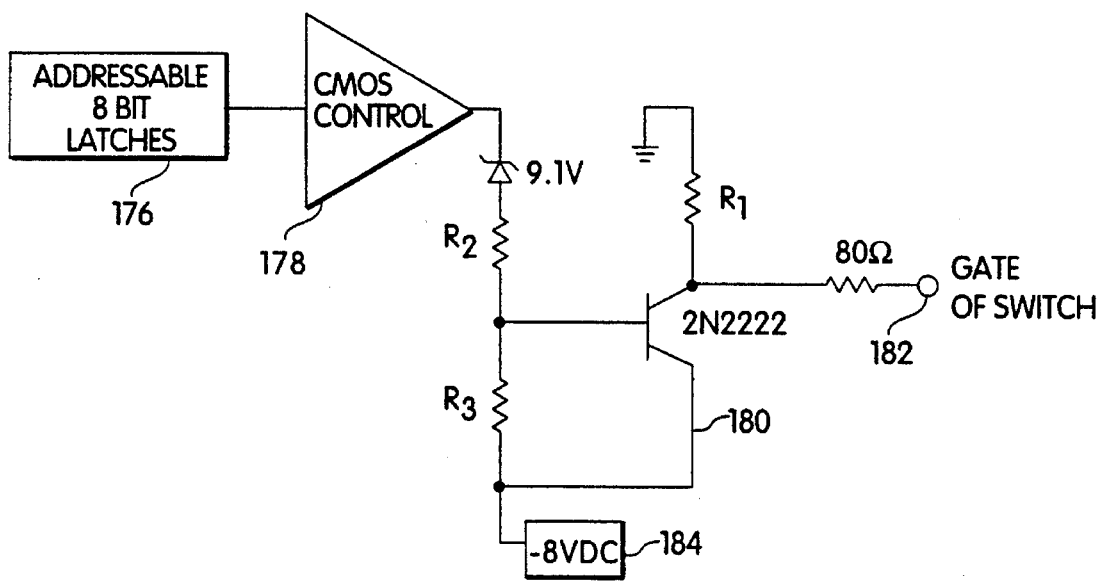
FIG. 12 is a schematic diagram of a control circuit for operating the multistate electronic transfer standard of FIG. 11.

FIG. 12 is a schematic diagram of a control circuit for controlling the microwave circuit of the second embodiment of the MSETS. The control logic consists of several addressable 8-bit latches 176 which are programmed to drive the single-pole, multi-throw switches of the circuit of FIG. 11 to any of the combinations discussed above. A voltage output by the addressable latch is input to a CMOS gate 178, to provide one of two voltages to each control line 182 of the single-pole, multi-throw switches of the circuit of FIG. 11. For example, in a preferred embodiment of the present invention, the voltages presented to the single-pole, multi-throw control lines are either 0 volts or −8 volts to turn the throw of each switch on and off, respectively. Accordingly, when the CMOS gate is in a high condition, the NPN transistor 180 is biased on and and output voltage at control line 182 is effectively connected to −8 volt DC supply 184. Alternatively, when the CMOS gate is low, the transistor is biased off and the output 182 is connected to ground through the resistor R1. In the preferred embodiment of the invention, resistors R1, R2, R3 are each 1.6 K Ohms.

Therefore, the circuits of FIGS. 11 and 12 comprise a second embodiment of an MSETS according to the present invention. The second embodiment can be used in the same manner as the first embodiment to calibrate a VNA for both an insertable and non-insertable DUT to be measured. Accordingly, an ultra-broadband calibration kit, according to the present invention, includes a first MSETS having a male connector at a first port and a female connector at a second port, a second MSETS having a male connector at a first port and a female connector at a second port, a first adapter having male connectors at each of its ports, a second adapter having female connectors at each of its ports, and a software package to control each of the embodiments of the MSETS'.

In both of the methods as described above, the scattering coefficients $S_{11A}$, $S_{21A}$, $S_{22A}$, and $S_{12A}$ must be measured, at a metrology laboratory for all possible conditions to be presented by the MSETS, during the original characterization of the MSETS. However, there is an alternative method, described infra, wherein these scattering coefficients need not be known, for all of the conditions to be presented by the MSETS, in order to compute the two-ports systematic errors of the VNA. In contrast, it is possible to initially characterize only three reflection coefficients, to be presented by the MSETS to each port of the VNA, and to compute all of the systematic error coefficients of the VNA.

Figure 13:
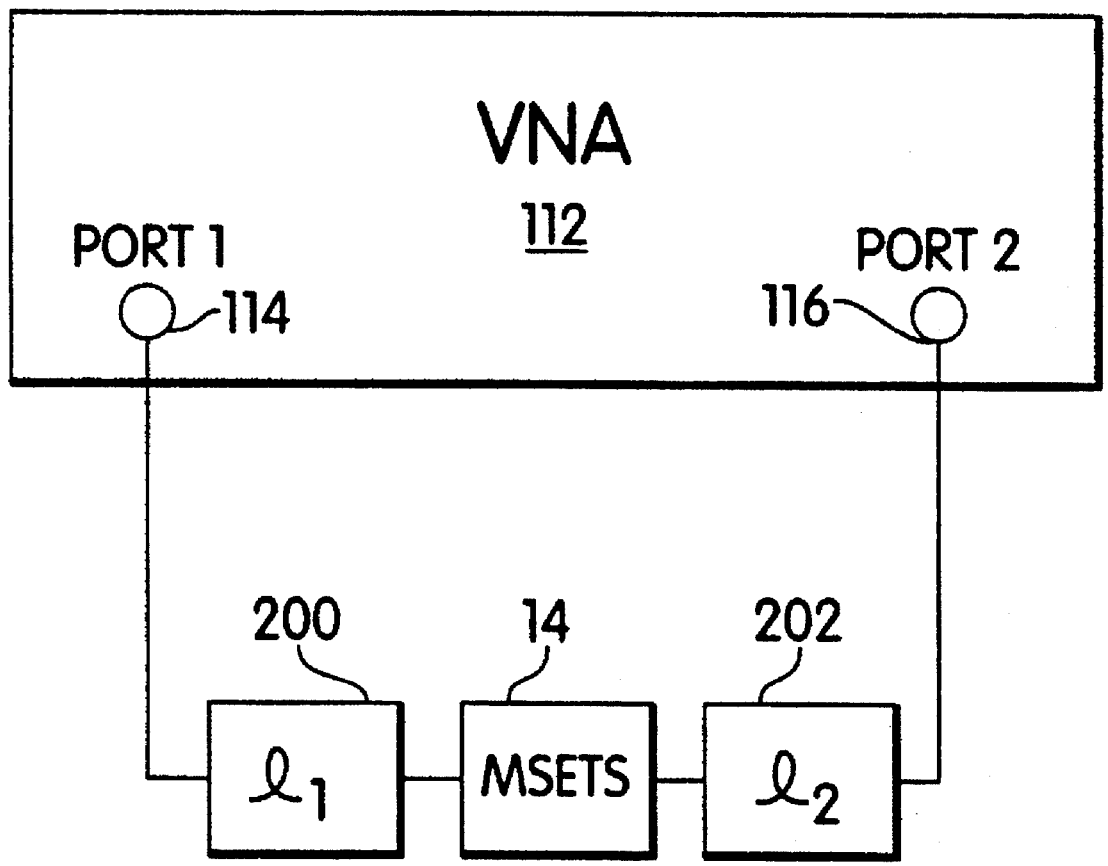
FIG. 13 is a schematic diagram illustrating error matrices associated with the VNA.

Referring now to FIG. 13, the two-port errors of the VNA can be modeled by the scattering matrices 200 and 202. The variables of the error scattering matrices are described in equation 19.

$$e_1 = \begin{bmatrix} e_1^{00} & e_1^{01} \\ e_1^{10} & e_1^{11} \end{bmatrix} \text{ AND } e_2 = \begin{bmatrix} e_2^{00} & e_2^{01} \\ e_2^{10} & e_2^{11} \end{bmatrix} \quad (19)$$

Where:

$e_1^{00}$, $e_2^{00}$ are directly of Port 1 and Port 2

$e_1^{11}$, $e_2^{11}$ are source match of Port 1 and Port 2

$e_1^{01}e_1^{01}$, $e_2^{10}$ are reflection tracking of Port 1 and Port 2

An uncorrected transmission matrix $T_m$ of the through state of the MSETS and a transmission matrix for the actual through state $T_A$ of the MSETS are as described in Equation 20.

$$T_m = K T_1 T_A T_2^{-1} \quad (20)$$

$$\text{Where } K = \frac{e_1^{01}}{e_2^{01}}, \; T_1 = \begin{bmatrix} -\frac{\Delta_1}{t_{11}} & \frac{e_1^{00}}{t_{11}} \\ -\frac{e_1^{11}}{t_{11}} & \frac{1}{t_{11}} \end{bmatrix}, \; T_2 = \begin{bmatrix} \frac{1}{t_{22}} & -\frac{e_2^{11}}{t_{22}} \\ \frac{e_2^{00}}{t_{22}} & -\frac{\Delta_2}{t_{22}} \end{bmatrix}$$

$t_{11} = e_1^{01}e_1^{10}$, $t_{22} = e_2^{01}e_2^{10}$, $\Delta_1 = e_1^{00}e_1^{11} - e_1^{10}e_1^{01}$ and $\Delta_2 = e_2^{00}e_2^{11} - e_2^{10}e_2^{01}$ Transmission matrices $T_1$ and $T_2$ can be calculated from the three known reflection coefficients presented by the MSETS to each port of the VNA. Due to the reciprocity of the MSETS, the transmission matrix $T_A$ has a unitary determinant. Therefore, Equation 20 can be written as:

$$det \, T_m = (K)^2 \, (det \, T_1) \, (det \, T_2)^{-1} \text{ Or } K^2 = \frac{(det \, T_m)(det \, T_2)}{det \, T_1} \quad (21)$$

Using Equation 16 and the boundary condition described above, the correct value of K can be determined without the need to know the electrical length of the through connection. The actual scattering matrix $T_A$ of the MSETS operating in the through state can now be calculated from Equation 22.

$$T_A = K^{-1}T_1^{-1}T_m T_2 \quad (22)$$

Defining $P = T_1^{-1}T_m T_2$, the actual scattering matrix of the through connection ($S_{Thru}$) is calculated from Equation 23.

$$S_{Thru} = \begin{bmatrix} \frac{P_{12}}{P_{22}} & \frac{\Delta P}{(P_{22})(K)} \\ \frac{K}{P_{22}} & -\frac{P_{21}}{P_{22}} \end{bmatrix} \quad (23)$$

$$\text{Where } P = \begin{bmatrix} P_{11} & P_{12} \\ P_{21} & P_{22} \end{bmatrix} \text{ and } \Delta P = P_{11}P_{22} - P_{12}P_{21}$$

Accordingly, the two-port systematic errors of a VNA can be calculated, by presenting only three known reflection coefficients, by the MSETS, to each port of the VNA. No additional knowledge of the transmission or reflection coefficients of the MSETS presented to the VNA (e.g. the through condition) is needed to fully characterize the two-port systematic errors of the VNA. The advantage of this method is that only six measurements of the MSETS, need be made by an operator at a metrology laboratory during the initial characterization of the MSETS. This reduces the number of measurements that need to be made as well as the amount of data that needs to be stored. In addition, this method lends itself to a simpler insertible and non-insertible calibration and therefore to a faster calibration process.

Figure 14:
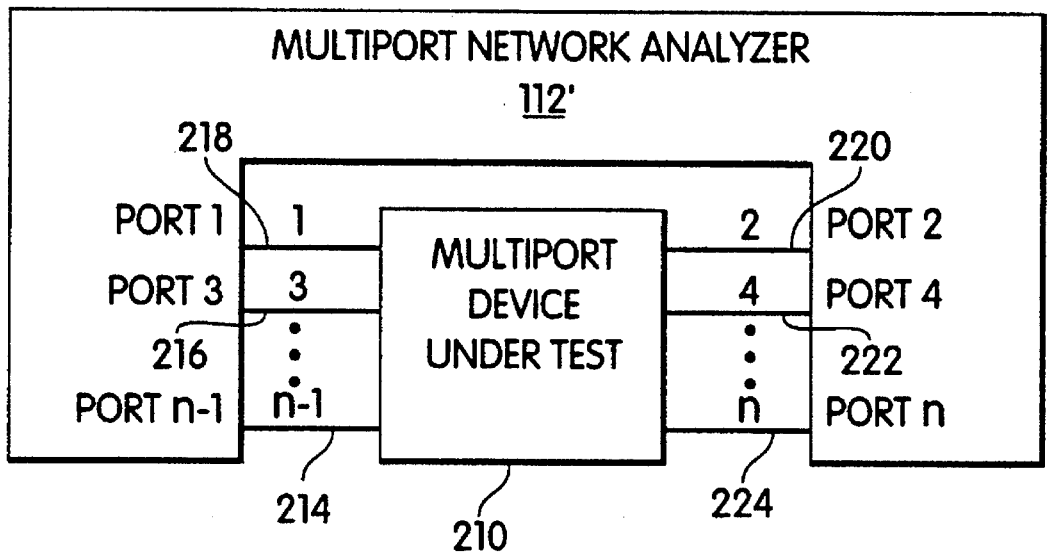
FIG. 14 is a schematic diagram illustrating connections to and between a multiport network analyzer and a multiport multistate electronic transfer standard.
Figure 15:
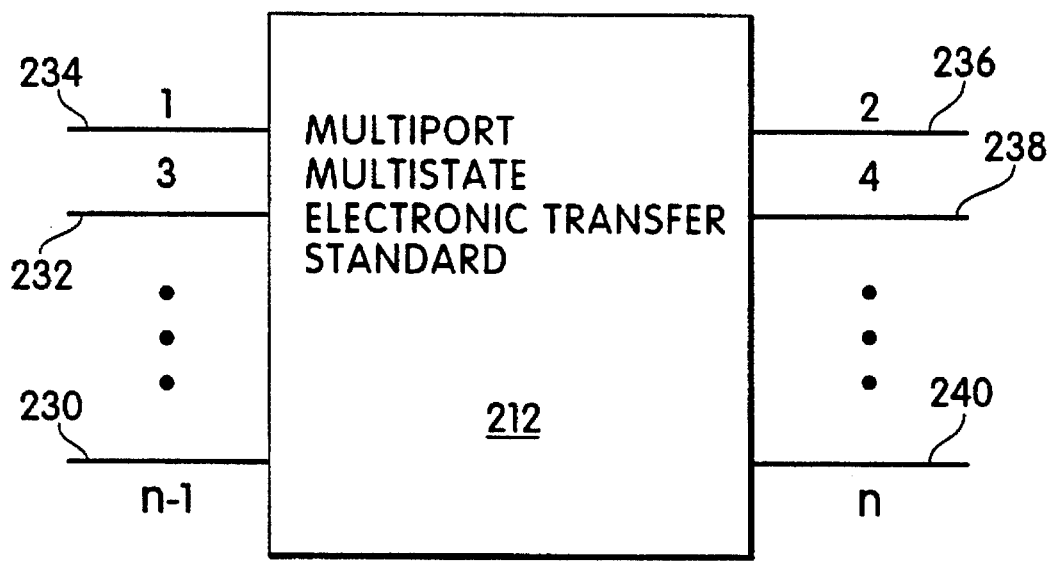
FIG. 15 is a block diagram of the multiport multistate electronic transfer standard.

The MSETS embodiments described above are used for calibrating a two-port VNA. However, there also exists a need to measure devices 210 with a plurality of ports 214, 216, 218, 220, 222 and 224, with a multiport network analyzer 112' as shown in FIG. 14. Accordingly, there is also a need to characterize the systematic errors of the multiport network analyzer 112' (MNA). In FIG. 15, there is shown a block diagram of a multiport, multistate electronic transfer standard 212 (MMETS) for calibrating the systematic errors of the MNA. An advantage of the MMETS is that there is no longer a need to connect multiple mechanical primary standards to each port 214, 216, 218, 220, 222 and 224 of the MNA. Instead a one-time connection may be established between each one of a plurality of ports 230, 232, 234, 236, 238 and 240 of the MMETS and each one of the plurality of the ports 214, 216, 218, 220, 222 and 224 of the MNA. The systematic errors of the MNA may then be determined by analyzing the MNA as a series of two-port VNA's.

Figure 16:
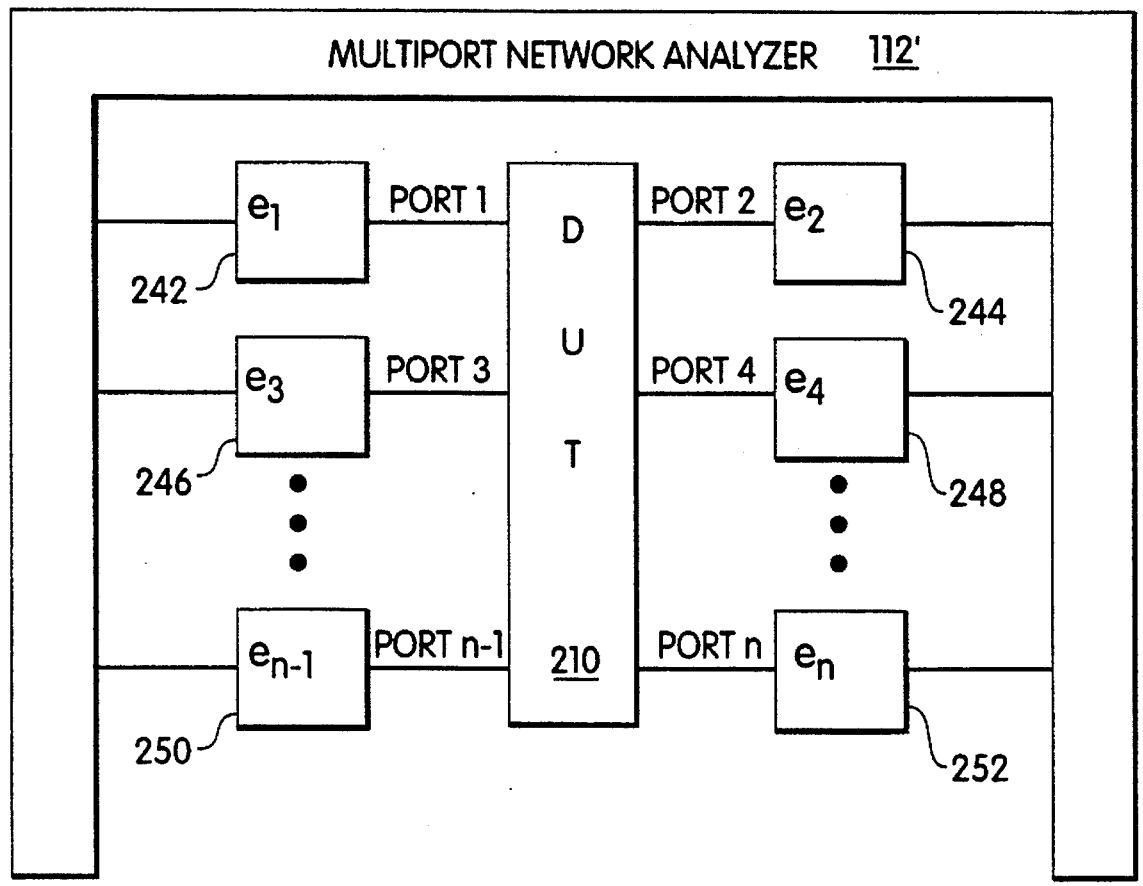
FIG. 16 is a schematic diagram illustrating a plurality of two-port error matrices which make up the multiport VNA.

Referring now to FIG. 16, there is shown two-port pairs of error matrices 242 and 244, 246 and 248, 250 and 252 of the MNA for determining the systematic errors of the MNA. As discussed above, one need only present three known reflection coefficients of the MMETS 212 to each port 214, 216, 218, 220, 222 and 224 of the MNA, for a total of six known reflection coefficients for each two-port pair, in order to compute all the systematic errors of the MNA. Accordingly, any DUT having any number of ports can be measured by a MNA after calibrating the MNA with the MMETS.

In all of the methods and embodiments described above, once the MSETS has been measured on a VNA by a metrology laboratory, it is used as a calibration standard by other vector network analyzers. Accordingly, it is desirable that the MSETS continue to reproduce the same conditions at its ports that were measured by the metrology laboratory.

Therefore, in accordance with a specific embodiment of the present invention, a heater is provided within the MSETS to insure long term temperature stability of the electronic circuitry of the present invention. In accordance with the preferred embodiment, the temperature is fixed at a temperature of 45° C. using a heating element located within a box or other enclosure for the circuitry (not shown).

An additional feature of the present invention is that the MSETS can be used to perform a high-power calibration of a VNA, using the embodiment disclosed in pending application Ser. No. 07/898,204 herein incorporated by reference.

An additional feature of the MSETS, according to the invention, is that it can also be used as a verification or accreditation device with other instruments, in addition to a VNA, because of its known characteristics. For example, this device can be used to verify the accuracy of a power meter by connecting the insertable MSETS between a power source and the power meter, stepping the insertable MSETS through known attenuation values and reading the power meter to see if the power meter reading reflects a change in power according to a known attenuation presented by the MSETS.

Still another application of the MSETS of the present invention is that the MSETS can be used to monitor changes in any RF instrumentation, over a period of time. For example, the systematic errors of the VNA can be monitored for a period of time and can be used as an indication of a status of the VNA. More specifically, the MSETS of the present invention can be periodically used to monitor the systematic errors of the VNA and the calculated error coefficients can be statistically analyzed to monitor the operability of the VNA and to detect whether any problems are developing with the VNA. This data can be collected in numerous ways. For example, an operator can collect the data over a telephone line, utilizing a computer having a modem tied into the MSETS, thereby allowing the VNA to be monitored without even having to be on-site where the VNA is located. The advantage of this feature is that a manufacturer of the VNA can utilize an MSETS as a diagnostic and preventative maintenance tool thereby enabling problems to be detected as they occur and minimizing downtime of any VNA, for example, in production lines where any lost time is critical. Alternatively, the collection of data need not be by a remote operator but rather can be in-house as part of a routine maintenance program.

Figure 17:
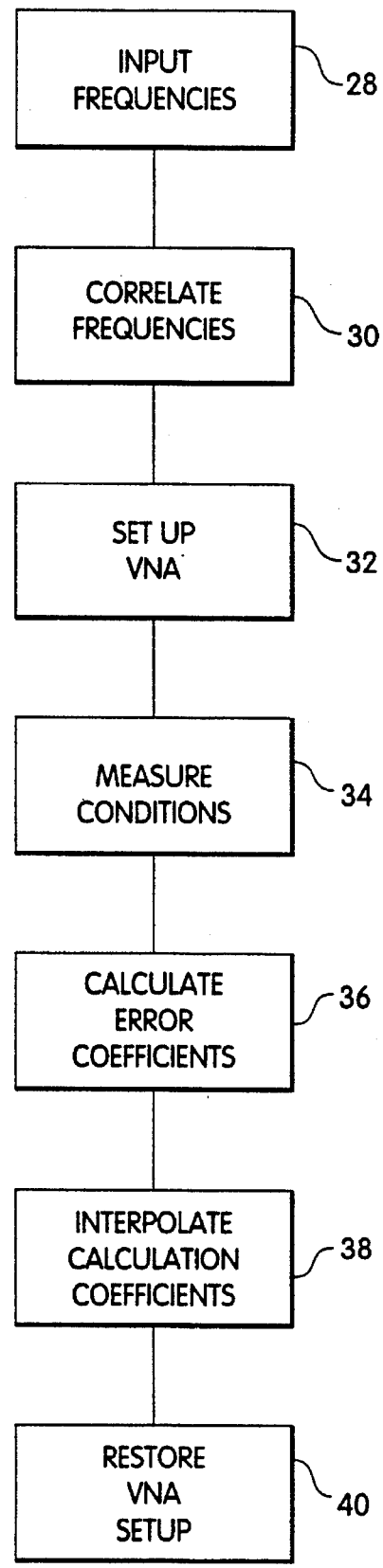
FIG. 17 is a flow diagram illustrating a computer control procedure for obtaining calibration coefficients according to this invention.

Referring now to FIG. 17, there is shown a flow diagram of a method of controlling and calibrating the VNA. First, the user inputs frequencies for which a measurement of the DUT is to be performed into a computer 16, as shown in FIG. 4 (Step 28). The frequencies are then correlated (Step 30) with the frequencies of the premeasured insertable calibration network to determine at which frequencies the calibration should be performed. Next the VNA is set up (Step 32) by loading the frequencies into the VNA in order to perform the calibration. Then the measurement of the MSETS is performed (Step 34), according to the methods described above. Once the measurements are finished, the error terms of the error model are computed (Step 36). These error terms are then used to interpolate to the appropriate frequencies for the DUT to be measured (Step 38). The VNA is then restored to its initial condition (Step 40) so that the MSETS can be disconnected and the DUT can be connected for measurement.

In one embodiment, the control routine is provided by a computer 16 (FIG. 4) having interconnections with the insertable MSETS 14 and VNA 12. For example, a Model 8510 Hewlett-Packard network analyzer is used and the computer is interconnected via line 18 to a standard port using a IEEE-488 standard connector. However, as noted above, the control routine and computer functions can be incorporated directly into the two-port MSETS 14, or can be provided to the VNA 12 separately.

Figure 18:
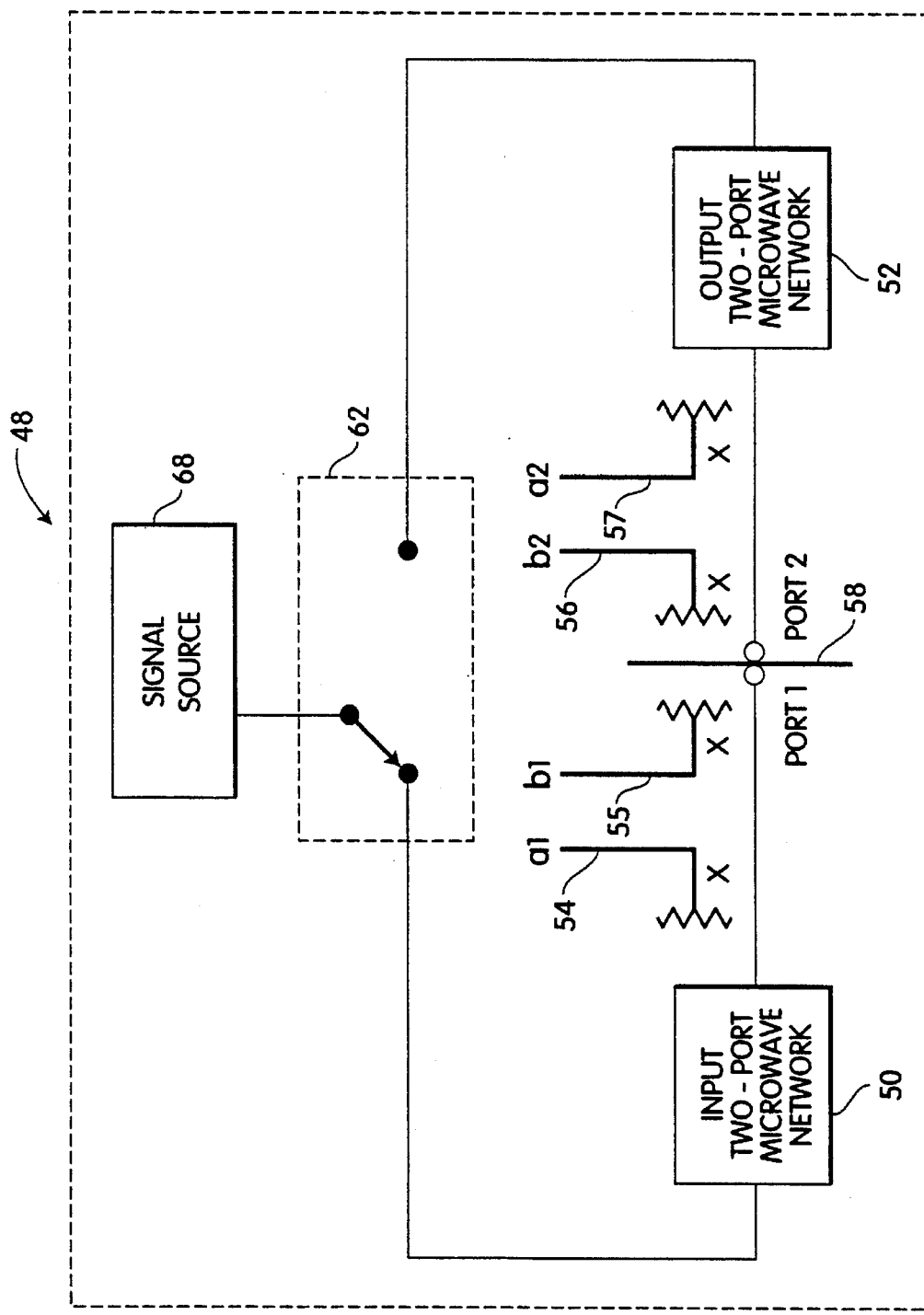
FIG. 18 is a schematic diagram of a self-calibrating VNA using a pair of multistate electronic transfer standards according to this invention.

Another application of the MSETS of the present invention is that it can be placed inside the VNA test set in order to derive a self-calibrating circuit 48 for a VNA. Referring to FIG. 18, two essentially identical MSETS' 50 and 52 are placed after the couplers 54, 55, 56 and 57 of the VNA and are controlled to present reflections coefficients to PORT 1 and PORT 2 of the VNA test set. Alternatively, the MSETS' can be placed before the couplers 54, 55, 56 and 57 of the VNA. With this embodiment, it is possible to calibrate the two MSETS' once and thereafter to use the two MSETS' as a self-calibrating VNA. Thus, it is possible to initially characterize the self-calibrating VNA, and then thereafter it is possible to self-calibrate the VNA each time that the VNA is to be used simply by making a through-connection between PORTS 1 and 2 of the self-calibrating VNA.

The self-calibrating VNA embodiment is particularly useful as a flexible network analyzer to be used to measure a DUT on any media which is particularly difficult to calibrate. For example, the self-calibrating VNA can be used to calibrate the VNA for on-wafer measurements by simply placing on-wafer probes, which are coupled to the ports of the VNA, on a through portion of a calibration standard and running the VNA through the self-calibration routine described below. Thus the self-calibrating VNA can be used to eliminate the tedious, and often very difficult, task of calibrating the VNA for on-wafer and fixture measurements.

Referring to FIG. 18, the initial calibration procedure to characterize the self-calibrating VNA is accomplished by performing a calibration at the device reference plane 58. This is accomplished by reverse-biasing all of the PIN diodes in each MSETS in order to establish a low-loss condition through each MSETS. The signal from signal source 68 may then be presented to PORT 1 by selecting the appropriate position of switch 62. The PIN diodes of the output MSETS are forward-biased in order to step through different impedances. The reflection coefficients resulting from the various impedances presented by the output MSETS 52 are measured at the device reference plane 58 thereby characterizing the output MSETS 52.

Similarly, the input MSETS 50 is characterized by reverse-biasing all of the PIN diodes of the output MSETS, by switching the position of switch 62 to send the RF signal to PORT 2, and by stepping the PIN diodes of the input MSETS 50 through various impedances and measuring the reflection coefficients at the device reference plane 58.

Once the self-calibrating VNA has been initially characterized, as per the calibration steps described above, the MSETS' can then be stepped through various impedances according to the steps described below to self-calibrate the VNA, without the need for making numerous connections or disconnections to PORTS 1 or 2 of the VNA or the need for human intervention. The steps of a self-calibration procedure of a self-calibrating VNA, as initially characterized above, are as follows according to one embodiment:

(1) Establish a through-connection between PORTS 1 and 2 of the VNA (2) determine the directivity EDF, source match ESF and reflection tracking ERF error terms at PORT 1 by measuring three impedances presented by the output MSETS 52 and (3) compute the error terms based upon the known initial values of these impedances $S_{11A}$ and utilizing Equation 2, as described above.

Then, (4) determine the directivity EDR, source match ESR and reflection tracking ERR error terms at PORT 2 by measuring the reflection coefficients presented at the device reference plane 58 by stepping the input MSETS through its various known impedances as characterized initially and utilizing Equation 4 to compute the error terms, as described above.

Then, (5) determine forward ELF and reverse ELR load match error terms by reverse-biasing all of the PIN diodes of both the input and output MSETS' and utilizing Equations 9 and 10 as discussed above. In Equations 9 and 10, $S_{11A}=S_{22A}=0$ and $S_{21A}=S_{12A}=1$ since there is now a through-connection between the ports of the VNA instead of an MSETS.

Next, (6) measure the forward $S_{21M}$ and reverse $S_{12M}$ transmission coefficients, with all of the PIN diodes in both MSETS' reverse-biased. All the parameters in Equations 11 and 12 are now known, with the exception of forward isolation EXF and reverse isolation EXR. It is customary, in the art of present network analyzers, to not bother calculating the error terms EXF and EXR and not to bother measuring isolation conditions between PORTS 1 and 2 of the VNA. Therefore, the terms EXF and EXR can be set to zero, and the forward transmission tracking ETF and the reverse transmission tracking ETR coefficients can be calculated utilizing equations 11 and 12.

Alternatively, an isolation measurement between PORTS 1 and 2 can be made by disconnecting the through-connection between PORTS 1 and 2 and reverse biasing, all of the PIN diodes of the input and output MSETS'. The error terms EXF and EXR can then be calculated utilizing Equations 7 and 8 as discussed previously. With the error terms EXF and EXR known, the error terms ETF and ETR can be calculated utilizing Equations 11 and 12. Thus, all of the error terms can be calculated with the embodiment as shown in FIG. 18. In addition, since the cable between PORTS 1 and 2 should be disconnected in order to make the DUT measurements, no extra steps are needed with the technique described above.

Figure 19:
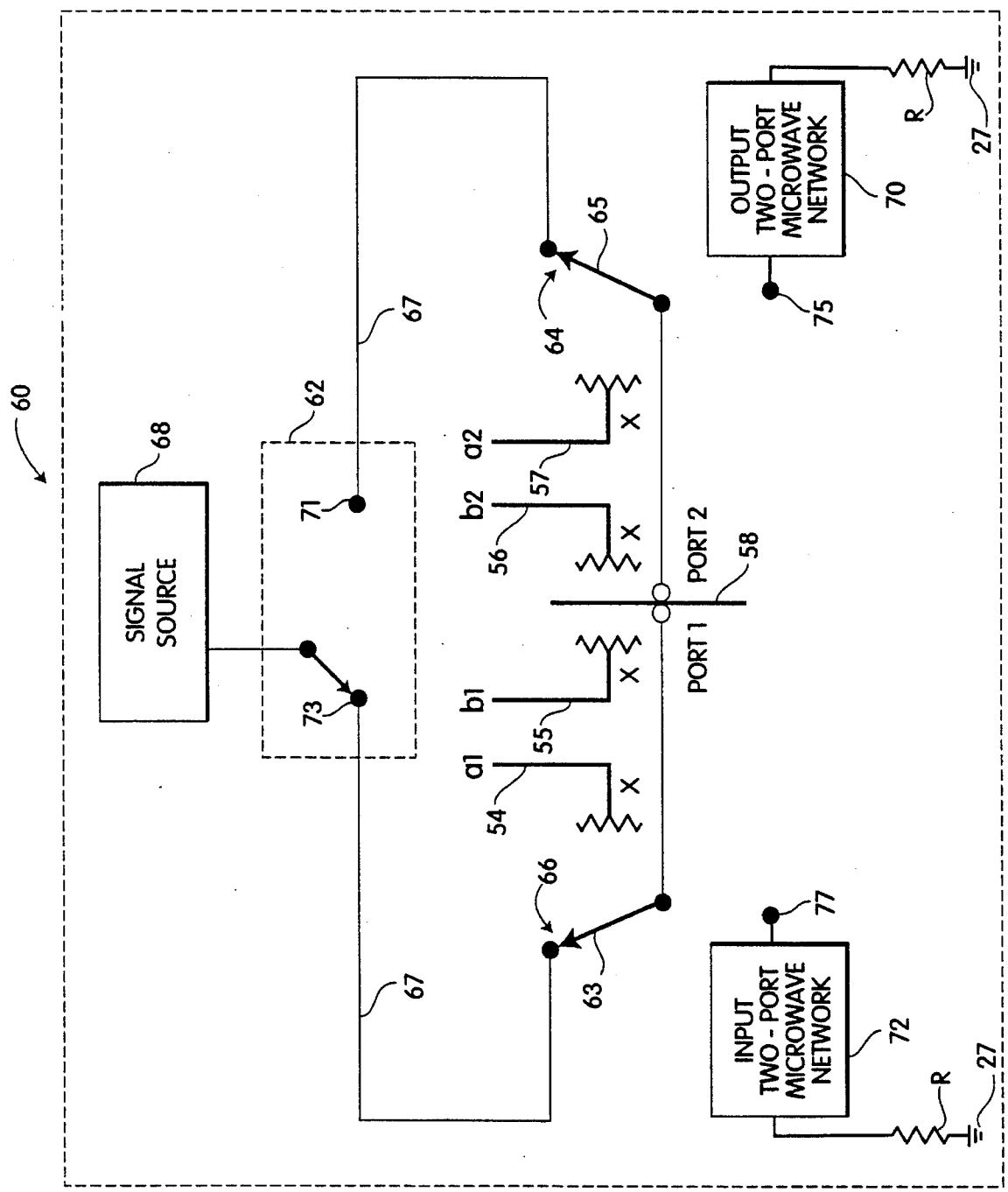
FIG. 19 is an alternate embodiment of a self-calibrating VNA according to this invention.

FIG. 19 is an alternate embodiment of a self-calibrating circuit 60 for a VNA which can be utilized in the same manner as described above with respect to the embodiment in FIG. 18, except that the initial calibration utilizing the conventional calibration technique is performed with single-pole, double-throw switches 64 and 66 configured such that PORT 1 and PORT 2 of the VNA are connected to the throws 63 and 65, which are, themselves connected to the cabling 67 from the signal source 68. Each of the input and output MSETS' 72 and 70 respectively are connected to ground 27 via matched termination R having a value of 50 Ohms. Thereafter the self-calibration routine can be performed using the steps described above where the single-pole, double-throw switches will be connected to the MSETS which is being utilized to establish the known impedances. In other words, throw 73 of single-pole, double-throw switch 62 is connected to the signal source 68, while pole 65 of single-pole, double-throw switch 64 is connected to (throw 75) the output MSETS 70 to characterize the output MSETS network 70. Similarly, throw 73 of single-pole, double-throw switch 62 is connected to the signal source 68 while pole 63 of single-pole, double-throw switch 66 is connected to (throw 77) the input MSETS 72 to characterize the input MSETS 72. Thereafter, the self-calibration routine is performed utilizing the steps described above with respect to the embodiment of FIG. 18.

Having now described the foregoing embodiments of the invention, it should be clear to those skilled in the art that the foregoing is merely illustrative and not limiting, having been presented by way of example only. Numerous modifications and other embodiments are within the scope of one of ordinary skill in the art and are contemplated as falling within the scope of the invention as defined by the pending claims in equivalents thereto and this description should be taken only by way of example.

What is claimed is:

1. A method for calibrating a network analyzer, having at least a first port and a second port, the method comprising the steps of:

presenting to a first port and a second port, three previously known reflection coefficients;

presenting a reciprocal through-condition to each of the first port and the second port;

measuring, with the network analyzer, the three previously known reflection coefficients and the through-condition;

evaluating an unwrapped phase of the through-condition; and calculating calibration coefficients of the network analyzer.

2. The method as claimed in claim 1, wherein the step of evaluating the unwrapped phase of the through-condition includes:

unwrapping a phase argument of the network analyzer as function of frequency to yield an unwrapped argument;

fitting the unwrapped argument to a polynomial expression; and selecting a DC term of the polynomial expression that is closest to zero to yield a phase shift of the through-condition.

3. The method as claimed in claim 1, wherein the steps of presenting the three previously known reflection coefficients and the step of presenting a reciprocal through-condition are performed with a multi-state transfer standard.

4. A method for periodically monitoring any changes in a microwave network analyzer, the network analyzer having first port and a second port, the method comprising the steps of:

generating a plurality of conditions, with a multistate electronic transfer standard, to at least one reference plane at a plurality of predetermined times, the plurality of conditions being generated free of connecting or disconnecting additional calibration standards to the first port and the second port of the network analyzer;

measuring, with the network analyzer, the plurality of conditions at the plurality of predetermined times; and deriving calibration coefficients of the network analyzer based upon the measurements of the plurality of generated conditions at the plurality of predetermined times; and analyzing the calibration coefficients for changes in instrumentation of the network analyzer.

5. The method as claimed in claim 4, wherein the calibration coefficients are analyzed to detect whether any problems exist within the instrumentation of the network analyzer.

6. The method as claimed in claim 4, wherein the step of analyzing includes remotely monitoring the changes in the calibration coefficients of the network analyzer for the purpose of diagnosing any problems in the network analyzer.

\* \* \* \* \*